(12) United States Patent
Bloom et al.

(10) Patent No.: US 11,728,128 B2
(45) Date of Patent: *Aug. 15, 2023

(54) ARBITRARY ELECTRON DOSE WAVEFORMS FOR ELECTRON MICROSCOPY

(71) Applicant: Integrated Dynamic Electron Solutions, Inc., Pleasanton, CA (US)

(72) Inventors: Ruth Shewmon Bloom, Oakland, CA (US); Bryan Walter Reed, San Leandro, CA (US); Daniel Joseph Masiel, Alamo, CA (US); Sang Tae Park, Danville, CA (US)

(73) Assignee: INTEGRATED DYNAMIC ELECTRON SOLUTIONS, INC., Pleasanton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/825,261

(22) Filed: May 26, 2022

(65) Prior Publication Data

US 2022/0406561 A1 Dec. 22, 2022

Related U.S. Application Data

(63) Continuation of application No. 17/688,339, filed on Mar. 7, 2022, now Pat. No. 11,476,082, which is a
(Continued)

(51) Int. Cl.
*H01J 37/24* (2006.01)
*H01J 37/29* (2006.01)
(Continued)

(52) U.S. Cl.
CPC .......... *H01J 37/243* (2013.01); *H01J 37/147* (2013.01); *H01J 37/28* (2013.01); *H01J 37/292* (2013.01)

(58) Field of Classification Search
CPC .......... H01J 37/00; H01J 37/02; H01J 37/023; H01J 37/1474; H01J 37/15; H01J 37/22;
(Continued)

(56) References Cited

U.S. PATENT DOCUMENTS

| 4,189,641 A | * | 2/1980 | Katagiri | ............... H01J 37/265 250/311 |
| 4,420,686 A | * | 12/1983 | Onoguchi | ............... H01J 37/28 250/311 |

(Continued)

FOREIGN PATENT DOCUMENTS

| WO | WO-2020178813 A1 | 9/2020 |
| WO | WO-2022220918 A1 | 10/2022 |

OTHER PUBLICATIONS

Béché et al. Development of a fast electromagnetic beam blanker for compressed sensing in scanning transmission electron microscopy. Appl. Phys. Lett. 108, 093103 (2016). 5 pages.
(Continued)

*Primary Examiner* — Jason L McCormack
(74) *Attorney, Agent, or Firm* — Wilson Sonsini Goodrich & Rosati

(57) ABSTRACT

A device may include an electron source, a detector, and a deflector. The electron source may be directed toward a sample area. The detector may receive an electron signal or an electron-induced signal. A deflector may be positioned between the electron source and the sample. The deflector may modulate an intensity of the electron source directed to the sample area according to an electron dose waveform having a continuously variable temporal profile.

24 Claims, 7 Drawing Sheets

Related U.S. Application Data continuation of application No. PCT/US2022/016479, filed on Feb. 15, 2022.

(60) Provisional application No. 63/176,115, filed on Apr. 16, 2021.

(51) Int. Cl.
  *H01J 37/28* (2006.01)
  *H01J 37/147* (2006.01)

(58) Field of Classification Search
  CPC ........ H01J 37/222; H01J 37/26; H01J 37/246; H01J 37/147; H01J 37/28; H01J 37/292
  USPC ......................................... 250/306, 307, 311
  See application file for complete search history.

(56) References Cited

U.S. PATENT DOCUMENTS

| | | | | |
|---|---|---|---|---|
| 5,874,735 | A * | 2/1999 | Matsumoto | H01J 37/28 |
| | | | | 250/310 |
| 7,253,410 | B1 * | 8/2007 | Bertsche | H01J 37/026 |
| | | | | 250/397 |
| 8,933,401 | B1 | 1/2015 | Reed | |
| 9,841,592 | B2 | 12/2017 | Reed | |
| 11,476,082 | B1 * | 10/2022 | Bloom | H01J 37/265 |
| 2005/0133733 | A1 * | 6/2005 | Nakasuji | G01N 23/04 |
| | | | | 250/492.1 |
| 2005/0211921 | A1 * | 9/2005 | Wieland | B82Y 40/00 |
| | | | | 250/492.2 |
| 2006/0022137 | A1 * | 2/2006 | Ohkura | H01J 37/256 |
| | | | | 250/310 |
| 2015/0332888 | A1 | 11/2015 | Reed et al. | |
| 2016/0189922 | A1 * | 6/2016 | Kooijman | G01N 23/2257 |
| | | | | 250/307 |
| 2017/0025247 | A1 * | 1/2017 | Stevens | H01J 37/26 |
| 2019/0287760 | A1 * | 9/2019 | He | H01J 37/26 |
| 2020/0176219 | A1 | 6/2020 | Shaked et al. | |
| 2021/0082661 | A1 * | 3/2021 | Bloom | H01J 37/1474 |

OTHER PUBLICATIONS

Béché et al. Development of a fast electromagnetic beam blanker for compressed sensing in scanning transmission electron microscopy. arXiv:1509.06656 (2015). Retrieved Mar. 11, 2022 at URL: https://arxiv.org/pdf/1509.06656. 7 pages.

Bücker et al. Electron beam dynamics in an ultrafast transmission electron microscope with Wehnelt electrode. Ultramicroscopy, vol. 171, pp. 8-18 (2016). Available online Aug. 20, 2016.

Beck et al. Fast Gradient-Based Algorithms for Constrained Total Variation Image Denoising and Deblurring Problems. IEEE Transactions on Image Processing, vol. 18, No. 11, pp. 2419-2434, Nov. 2009.

Browning et al. Implementing Sub-sampling Methods for Low-Dose (Scanning) Transmission Electron Microscopy (S/TEM). Microsc. Microanal. 23 (Suppl 1), pp. 82-83 (2017).

Candes et al. An Introduction To Compressive Sampling. IEEE Signal Processing Magazine, pp. 21-30 (Mar. 2008).

Candes, et al. Robust uncertainty principles: Exact signal reconstruction from highly incomplete frequency information. IEEE Transactions on information theory. 2006; 52(2):489-509.

Choe et al. Mitigation of radiation damage in biological macromolecules via tunable picosecond pulsed transmission electron microscopy. Preprint. bioRxiv. Version posted Aug. 4, 2020. Retrieved Mar. 11, 2022 at URL: https://www.biorxiv.org/content/10.1101/2020.05.15.099036v2.full.pdf. 25 pages.

DigitalMicrograph Software. Web page. Gatan, Inc. 2022. Retrieved Mar. 14, 2022 at URL: https://www.gatan.com/products/tem-analysis/gatan-microscopy-suite-software. 5 pages.

Duarte et al. Multiscale Random Projections for Compressive Classification. 2007 IEEE International Conference on Image Processing, 2007, pp. VI-161-VI-164.

Duarte, et al. Single-pixel imaging via compressive sampling. IEEE Signal Processing Magazine. 2008; 25(2):83-91.

Electrostatic Dose Modulator. Brochure. JEOL / IDES. May 7, 2020. 2 pages.

Harmany et al. This is SPIRAL-TAP: Sparse Poisson Intensity Reconstruction ALgorithms—Theory and Practice. IEEE Transactions on Image Processing, vol. 21, No. 3, pp. 1084-1096 (Mar. 2012). Downloaded Mar. 14, 2022 from: URL: https://arxiv.org/pdf/1005.4274.

Helios 5 UX DualBeam. Data Sheet. Thermo Fisher Scientific. 2019. Retrieved Mar. 11, 2022 at URL: https://assets.thermofisher.com/TFS-Assets/MSD/Datasheets/Helios%205%20UX%20DualBeam%20Semiconductor%20Datasheet. pdf. 4 pages.

Jeol Ides EDM: Electrostatics Dose Modulator (2nd ver), Published to youtube Dec. 2, 2020. First version of video distributed to sales teams May 22, 2020. Screen captures retrieved Mar. 17, 2022 from the Internet: https://www.youtube.com/watch?v=JK5W6bNdkOM. 24 pages.

Jeol-Ides Products. Web Page. Went live May 27, 2020. Retrieved Mar. 11, 2022 at URL: https://www.jeol.co.jp/en/products/detail/JEOL-IDES_Products.html. 4 pages.

Ji et al. Influence of cathode geometry on electron dynamics in an ultrafast electron microscope. Struct. Dyn. 4, 054303 (2017). Published online Jul. 17, 2017. 18 pages.

Kudryashov et al. Grey scale structures formation in SU-8 with e-beam and UV. Microelectronic Engineering, vol. 67-68, pp. 306-311 (2003).

Lagrange et al. Movie-mode dynamic electron microscopy. MRS Bulletin, vol. 40, pp. 22-28 (Jan. 2015).

M & M 2017, Microscopy & Microanalysis, Onsite Program Guide & Exhibitor Information, Aug. 6-10, 2017, St. Louis, MO. Downloaded Mar. 14, 2022 at URL: https://www.microscopy.org/MandM/2017/program/OnsiteProgram2017_Web.pdf. 248 pages.

Midgley. Sparsity, Parsimony and Data Reduction—Applications across Multi-Dimensional Electron Microscopy. Microsc. Microanal. 23 (Suppl 1), pp. 112-113 (2017).

Moerland et al. Time-resolved cathodoluminescence microscopy with sub-nanosecond beam blanking for direct evaluation of the local density of states. Opt. Express 24, 24760-24772 (2016).

Olshin et al. Atomic-Resolution Imaging of Fast Nanoscale Dynamics with Bright Microsecond Electron Pulses. Nano Lett. 2021, 21, 1, 612-618. Epub Dec. 10, 2020.

Ophus et al. Computational Methods for Large Scale Scanning Transmission Electron Microscopy (STEM) Experiments and Simulations. Microsc. Microanal. 23 (Suppl 1), pp. 162-163 (2017).

PCT/US2022/016479 International Search Report and Written Opinion dated May 31, 2022.

Piazza et al. Design and implementation of a fs-resolved transmission electron microscope based on thermionic gun technology. Chemical Physics 423 (2013) 79-84. Available online Jul. 9, 2013.

Piazza et al. Simultaneous observation of the quantization and the interference pattern of a plasmonic near-field. Nature Communications, 6:6407 (Mar. 2, 2015). 7 pages.

Price Schedule. IDES. Provided to Sales Team Apr. 21, 2020. One page.

Qiu et al. GHz laser-free time-resolved transmission electron microscopy: A stroboscopic high-duty-cycle method. Ultramicroscopy, vol. 161, pp. 130-136 (Feb. 2016). Retrieved Mar. 14, 2022 at URL: https://www.sciencedirect.com/science/article/am/pii/S030439911530067X.

Reed et al. Background Removal and Data Analysis for Low-Loss Transmission Electron Energy-Loss Spectroscopy. Microscopy and Microanalysis, 8(S02), 598-599 (2002).

Reed et al. Compressively Sensed Video Acquisition in Transmission Electron Microscopy. Microsc. Microanal. 23 (Suppl 1), pp. 84-85 (2017).

Specifications for Electrostatic Dose Modulator. Version 1.06. IDES, Inc. Apr. 20, 2020. Provided to Sales Team Apr. 21, 2020. 7 pages.

Stevens, et al. Applying compressive sensing to TEM video: a substantial frame rate increase on any camera. Advanced Structural and Chemical Imaging. 2015; 1(10):1-20.

(56) References Cited

OTHER PUBLICATIONS

Vandenbussche et al. Mitigating Damage to Hybrid Perovskites Using Pulsed-Beam TEM. ACS Omega 2020, 5, 31867-31871.
Zhou et al. Non-Parametric Bayesian Dictionary Learning for Sparse Image Representations. In Advances in neural information processing systems, Bengio et al, eds., Neural Information Processing Systems Foundation, USA, vol. 22, pp. 2295-2303 (2009).
U.S. Appl. No. 17/688,339 Notice of Allowance dated Jul. 11, 2022.
U.S. Appl. No. 17/688,339 Notice of Allowance dated May 4, 2022.
Auad et al. Event-based hyperspectral EELS: towards nanosecond temporal resolution. Microsc. Microanal. 28 (Suppl 1), pp. 2648-2649 (2022). Retrieved Feb. 10, 2023 at URL: https://scholar.archive.org/work/5ipzkkykuzffjn4ujikmcelkfi/access/wayback/https://www.cambridge.org/core/services/aop-cambridge-core/content/view/205AD43BA851BBE23B0724042D8CCEA8/S1431927622010030a.pdf/div-class-title-event-based-hyperspectral-eels-towards-nanosecond-temporal-resolution-div.pdf.
Berkels et al. Optimized imaging using non-rigid registration. Ultramicroscopy, vol. 138, pp. 46-56 (Mar. 2014). Retrieved Feb. 10, 2023 at URL: https://arxiv.org/pdf/1403.6774.
Co-pending U.S. Appl. No. 18/104,101, inventors REED; Bryan Walter et al., filed Jan. 31, 2023.
Crozier. Vibrational and valence aloof beam EELS: A potential tool for nondestructive characterization of nanoparticle surfaces. Ultramicroscopy, vol. 180, pp. 104-114 (Sep. 2017). Retrieved Feb. 10, 2023 at URL: https://www.sciencedirect.com/science/article/am/pii/S0304399117301080.
Dekkers et al. Differential Phase Contract in a STEM. OPTIK, vol. 41, No. 4, pp. 452-456 (1974).
E et al. Probe integrated scattering cross sections in the analysis of atomic resolution HAADF STEM images. Ultramicroscopy 133 (2013) 109-119. Available online Jul. 15, 2013.
Hedley et al. Fast Ptychographic Reconstruction for Sparse Binary Ptychography Data. Microsc. Microanal. 28 (Suppl 1), pp. 438-439 (2022). Retrieved Feb. 9, 2023 at URL: https://www.cambridge.org/core/services/aop-cambridge-core/content/view/E542D2827CB555495B0D2377FB62B196/S1431927622002446a.pdf/div-class-title-fast-ptychographic-reconstruction-for-sparse-binary-ptychography-data-div.pdf.
Jones et al. Identifying and Correcting Scan Noise and Drift in the Scanning Transmission Electron Microscope. Microscopy and Microanalysis 19(4), 1050-1060 (2013). Retrieved Feb. 9, 2023 at URL: https://academic.oup.com/mam/article-pdf/19/4/1050/48228098/mam1050.pdf.
Jones et al. Smart Align—a new tool for robust non-rigid registration of scanning microscope data. Advanced Structural and Chemical Imaging (2015) 1:8. 16 pages.
Jones. Practical Aspects of Quantitative and High-Fidelity STEM Data Recording. In Bruma, ed. Scanning Transmission Electron Microscope, First Edition. First published 2020. CRC Press, Boca Raton, FL. 39 pages.
Kim et al. Quantitative measurement of strain field in strained-channel-transistor arrays by scanning moiré fringe imaging. Appl. Phys. Lett. 103, 033523 (2013). Published online Jul. 19, 2013. 3 pages.
Kovarik et al. Implementing an accurate and rapid sparse sampling approach for low-dose atomic resolution STEM imaging. Applied Physics Letters 109, 164102 (2016). Published online Oct. 21, 2016. 5 pages.
Lebeau. Experimental quantification of annular dark-field images in scanning transmission electron microscopy. Ultramicroscopy 108 (2008) 1653-1658.
Mullarkey et al. Development of a Practicable Digital Pulse Read-Out for Dark-Field STEM. Microscopy and Microanalysis 27, 99-108 (2021).
Mullarkey et al. Using Your Beam Efficiently: Reducing Electron Dose in the STEM via Flyback Compensation. Microscopy and Microanalysis (2022), 28, 1428-1436. Retrieved Feb. 8, 2023 at URL: https://www.cambridge.org/core/services/aop-cambridge-core/content/view/7A31C592194246BAA680266CBC0D6525/S1431927621013908a.pdf/using-your-beam-efficiently-reducing-electron-dose-in-the-stem-via-flyback-compensation.pdf.
Müller et al. Atomic electric fields revealed by a quantum mechanical approach to electron picodiffraction. Nature Communications 5:5653 (Dec. 15, 2014). 8 pages.
Ophus. Four-Dimensional Scanning Transmission Electron Microscopy (4D-STEM): From Scanning Nanodiffraction to Ptychography and Beyond. Microscopy and Microanalysis 25, 563-582 (2019). Retrieved Feb. 9, 2023 at URL: https://www.cambridge.org/core/services/aop-cambridge-core/content/view/A7E922A2C5BFD7FD3F208C537B872B7A/S1431927619000497a_hi.pdf/_div_class_title_Four-Dimensional_Scanning_Transmission_Electron_Microscopy_4D-STEM_From_Scanning_Nanodiffraction_to_Ptychography_and_Beyond_div-.pdf.
Peters et al. Improving the Noise Floor and Speed of Your Detector: A Modular Hardware Approach for Under $1000. Microsc. Microanal. 28 (Suppl 1), pp. 2904-2906 (2022). Retrieved Feb. 8, 2023 at URL: https://www.cambridge.org/core/services/aop-cambridge-core/content/view/DB98785BA272EA7BDCD028F3EE180C36/S143192762201090Xa.pdf/improving-the-noise-floor-and-speed-of-your-detector-a-modular-hardware-approach-for-under-dollar1000.pdf.
Reed et al. Electrostatic Switching for Spatiotemporal Dose Control in a Transmission Electron Microscope. Microsc. Microanal. 28 (Suppl 1), pp. 2230-2231 (2022). Retrieved Feb. 8, 2023 at URL: https://www.cambridge.org/core/services/aop-cambridge-core/content/view/C814A631FCD8F968290E892CA0D11A1D/S1431927622008595a.pdf/electrostatic-switching-for-spatiotemporal-dose-control-in-a-transmission-electron-microscope.pdf.
Rez et al. Damage-free vibrational spectroscopy of biological materials in the electron microscope. Nature Communications 7:10945 (Mar. 10, 2016). 8 pages.
Rosenauer et al. Measurement of composition profiles in III-nitrides by quantitative scanning transmission electron microscopy. J. Phys.: Conf. Ser. 209 012009 (2010). 4 pages.
Sanders et al. Inpainting vs denoising for dose reduction in scanning-beam microscopies. Manuscript received and revised. Published in IEEE Transactions on Image Processing, vol. 29, pp. 351-359 (2020). Retrieved Feb. 10, 2023 at URL: https://www.researchgate.net/profile/Toby-Sanders-2/publication/334526461_Inpainting_vs_denoising_for_dose_reduction_in_scanning-beam_microscopies/links/600eeda2a6fdccdcb87b76bd/Inpainting-vs-denoising-for-dose-reduction-in-scanning-beam-microscopies.pdf.
Sang et al. Revolving scanning transmission electron microscopy: Correcting sample drift distortion without prior knowledge. Ultramicroscopy 138 (2014) 28-35. Available online Dec. 31, 2013.
Stroppa et al. High-Resolution Scanning Transmission Electron Microscopy (HRSTEM) Techniques: High-Resolution Imaging and Spectroscopy Side by Side. ChemPhysChem 2012, 13, 437-443.

\* cited by examiner

ARBITRARY ELECTRON DOSE WAVEFORMS FOR ELECTRON MICROSCOPY

CROSS-REFERENCE

This application is a continuation of U.S. application Ser. No. 17/688,339, filed Mar. 7, 2022, which is a continuation of International Application No. PCT/US2022/016479, filed Feb. 15, 2022, which claims the benefit of U.S. Provisional Application No. 63/176,115, filed on Apr. 16, 2021, all of which are incorporated by reference herein for all purposes.

STATEMENT AS TO FEDERALLY SPONSORED RESEARCH

This invention was made with the support of the United States government under Award number DE-SC0013104 granted by the U.S. Department of Energy.

BACKGROUND

An electron microscope may comprise various systems and methods for delivering an electron dose. For example, in transmission electron microcopy, high-energy electrons may pass through a sample from above and form an image on a detector below. This process, which is intended to measure the properties of a sample, may change the sample and may even damage the sample.

SUMMARY

Applicant has recognized that there is an unmet need for new methods and systems for temporally modulating the electron dose on a transmission electron microscope. Systems and methods of the present disclosure allow the functional form and timescale of the dose (e.g., an electron dose waveform) to be tailored to the dynamics of the sample in a fast, precise, and repeatable fashion. Methods and systems disclosed herein may be used to reduce or control the effects of the electron dose during a transmission electron microscopy (TEM) measurement.

Systems and methods disclosed herein may improve on methods of adjusting the electron dose that operate, for example, by modulating electron optical settings of the electron beam. Such settings may include beam current, convergence angle, and aperture size. Adjusting the electron optical settings may not allow for an electron dose to be modulated on a fast timescale. Further, aligning electron optics for transmission electron microscopy to achieve atomic resolution may be complex and may involve adjusting multiple interconnected parameters within the electron optical system.

Systems and methods disclosed herein may provide at least some of the following, non-limiting advantages: allowing the average dose to be adjusted on a fast timescale; allowing the average dose to execute an arbitrary function with respect to time; allowing the average dose (e.g., the duty cycle) to be continuously varied across a range from 0 to 100% dose transmission; allowing the dose waveform to be synchronized to a detector, a stimulus to the sample, or a change in the electron-optical conditions of the microscope; allowing the dose waveform to be calculated and adjusted by an algorithm which may consider one or more of information about the sample, deflection electronics, detectors involved in the measurement, and the determined waveform input into the control software by the user; allowing the temporal profile of the pump pulse, probe pulse, or both to be customized in a pump-probe experiment; reducing limitations on the dose waveform created by the physical constraints of ultrafast pulsed electron sources such as laser-driven cathodes and radio-frequency pulsers, e.g., a limited dynamic range and/or duration for the waveform; allowing the dose waveform to be applied at a selectable accelerating voltage available for the electron beam; and allowing the pulses which comprise the dose waveform to occur at a nonuniform repetition rate.

In an aspect, the present disclosure provides a device. The device may comprise: an electron source directed toward a sample area; a detector for receiving an electron signal or an electron-induced signal; and a deflector positioned between the electron source and the sample, wherein the deflector modulates an intensity of the electron source directed to the sample area according to an electron dose waveform having a continuously variable temporal profile.

In another aspect, the present disclosure provides a device. The device may comprise: an electron source directed toward a sample area; a detector for receiving an electron signal or an electron-induced signal; and a deflector positioned between the electron source and the sample, wherein the deflector modulates an intensity of the electron source directed to the sample area according to an electron dose waveform having a variable temporal profile, the variable temporal profile comprising: a selectable non-regular pulse width, a selectable non-regular repetition rate, or both.

In some embodiments, the electron dose waveform comprises an arbitrarily defined temporal profile. In some embodiments, the waveform comprises a series of waypoints. In some embodiments, the series of waypoints are individually or collectively selectable to construct the arbitrarily defined temporal profile. In some embodiments, the series comprises greater than 1000 waypoints. In some embodiments, the arbitrarily defined temporal profile comprises a temporal resolution of less than 10 ns. In some embodiments, the arbitrarily defined temporal profile is indicated by a user.

In some embodiments, the deflector comprises a driving electrode and an electrode at a fixed voltage. In some embodiments, the deflector comprises two driving electrodes. In some embodiments, the electron dose waveform modulates an average intensity of the electron source directed toward the sample area. In some embodiments, the average intensity is modulated substantially without change to other image conditions. In some embodiments, the device comprises a physical or virtual knob to adjust the average intensity. In some embodiments, the average intensity is controllable independently of a driving voltage of the electron source. In some embodiments, the average intensity is continuously variable across a range from 0 to 100% dose transmission.

In some embodiments, the electron dose waveform comprises a periodic waveform. In some embodiments, the electron dose waveform is aperiodic. In some embodiments, the electron dose waveform comprises a pump and a probe pulse. In some embodiments, the electron dose waveform is a square wave. In some embodiments, a transition time between a high voltage and a low voltage is less than about 50 ns, defined as a sum of a ringing time plus a slope time. In some embodiments, a transition time between a high voltage and a low voltage is less than about 10 ns, defined as a slope time from about 10% to about 90% a transition voltage. In some embodiments, a pulse width of the square wave is aperiodic. In some embodiments, the electron dose waveform comprises a shortest exposure time of about 100 ns.

In some embodiments, the device comprises: a pattern generator configured to produce an electrical signal representative of the electron dose waveform; and a driver electronics configured to receive the electrical signal from the pattern generator and supply a voltage comprising the electron dose waveform to the deflector. In some embodiments, the device comprises one or more computer processors comprising instructions that when executed are configured to: receive an indication of the electron dose waveform; and deliver the indication to the pattern generator.

In some embodiments, the one or more computer processors comprise instructions to adjust a shape of the electron dose waveform according to one or more parameters. In some embodiments, the one or more parameters comprise information about one or more of a property of an image from the detector, a property of the deflector, a property of the driver electronics, a property of the detector, and the indication of the electron dose waveform. In some embodiments, the one or more parameters comprises an indication of a minimum, a maximum or a fixed value for a pulse width or a pulse repetition rate of the electron dose waveform.

In some embodiments, the one or more parameters comprises a timing constraint of the deflector, the driver electronics, or the pattern generator. In some embodiments, the one or more parameters comprises a characteristic timescale of a sample or a process within the sample. In some embodiments, the one or more parameters comprises a time-dependent voltage bias or temperature. In some embodiments, the one or more parameters comprises a dose rate or a timing consideration of the detector. In some embodiments, the one or more parameters comprises an indication of a data signal quality from a collected or a real-time measurement. In some embodiments, the one or more parameters comprises an indication an effect of the intensity of the electron dose waveform on a sample from a collected or a real-time measurement.

In some embodiments, the one or more processors comprises instructions to adjust a timing of the electron dose waveform relative to a collection time of the detector, a location of one or more sub-portions of the detector, an arrival time of a stimulus to the sample area, or a change in an electron-optical condition of the device. In some embodiments, the pattern generator is an analog or a digital pattern generator. In some embodiments, the pattern generator comprises an analog to digital converter.

In another aspect, the present disclosure provides a method for modulating a dose in a transmission electron microscope image. The method may comprise: providing an electron source directed toward a sample area; receiving an electron dose waveform at a deflector disposed between the electron source and the sample area, wherein the electron dose waveform modulates an intensity of the electron source directed to the sample area according to the electron dose waveform; and outputting an electron signal or an electron-induced signal relating to at least a portion of the modulated intensity.

In some embodiments, the electron dose waveform comprises a continuously temporal variable profile. In some embodiments, the electron dose waveform comprises an arbitrarily defined temporal profile. In some embodiments, the waveform comprises a series of waypoints. In some embodiments, the series of waypoints are individually or collectively selectable to construct the arbitrarily defined temporal profile. In some embodiments, the series comprises greater than 1000 waypoints. In some embodiments, the arbitrarily defined temporal profile comprises a temporal resolution of less than 10 ns. In some embodiments, the method comprises receiving an indication of the arbitrarily defined temporal profile from a user. In some embodiments, the method further comprises providing the device of any aspect or embodiment.

In another aspect, the present disclosure provides a computer implemented method for modulating an electron dose on a transmission electron microscope (TEM). The method may comprise: (a) receiving at a processor an indication of an electron dose waveform comprising a representation of a temporal profile of an intensity of an electron dose directed to a sample area within the TEM; (b) transmitting the indication to the TEM, wherein an electrical signal representative of the indication drives a deflector within the TEM, thereby modulating the temporal profile of the electron dose; (c) receiving one or more tunable parameters, the one or more tunable parameters comprising information about one or more of: a property of a TEM image, a property of the deflector, a property of a driver electronics within the TEM, a property of a detector within the TEM, and the indication of the electron dose waveform; and (d) updating the indication of the electron dose waveform based on the one or more parameters.

In some embodiments, the method may comprise continuously updating the indication of the electron dose waveform. In some embodiments, the method further comprises providing the device of any aspect or embodiment.

Another aspect of the present disclosure provides a system comprising one or more computer processors and computer memory coupled thereto. The computer memory comprises machine executable code that, upon execution by the one or more computer processors, implements any of the methods above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference in their entirety to the same extent as if each individual publication, patent, or patent application was specifically and individually indicated to be incorporated by reference in its entirety. In the event of a conflict between a term herein and a term in an incorporated reference, the term herein controls.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1:
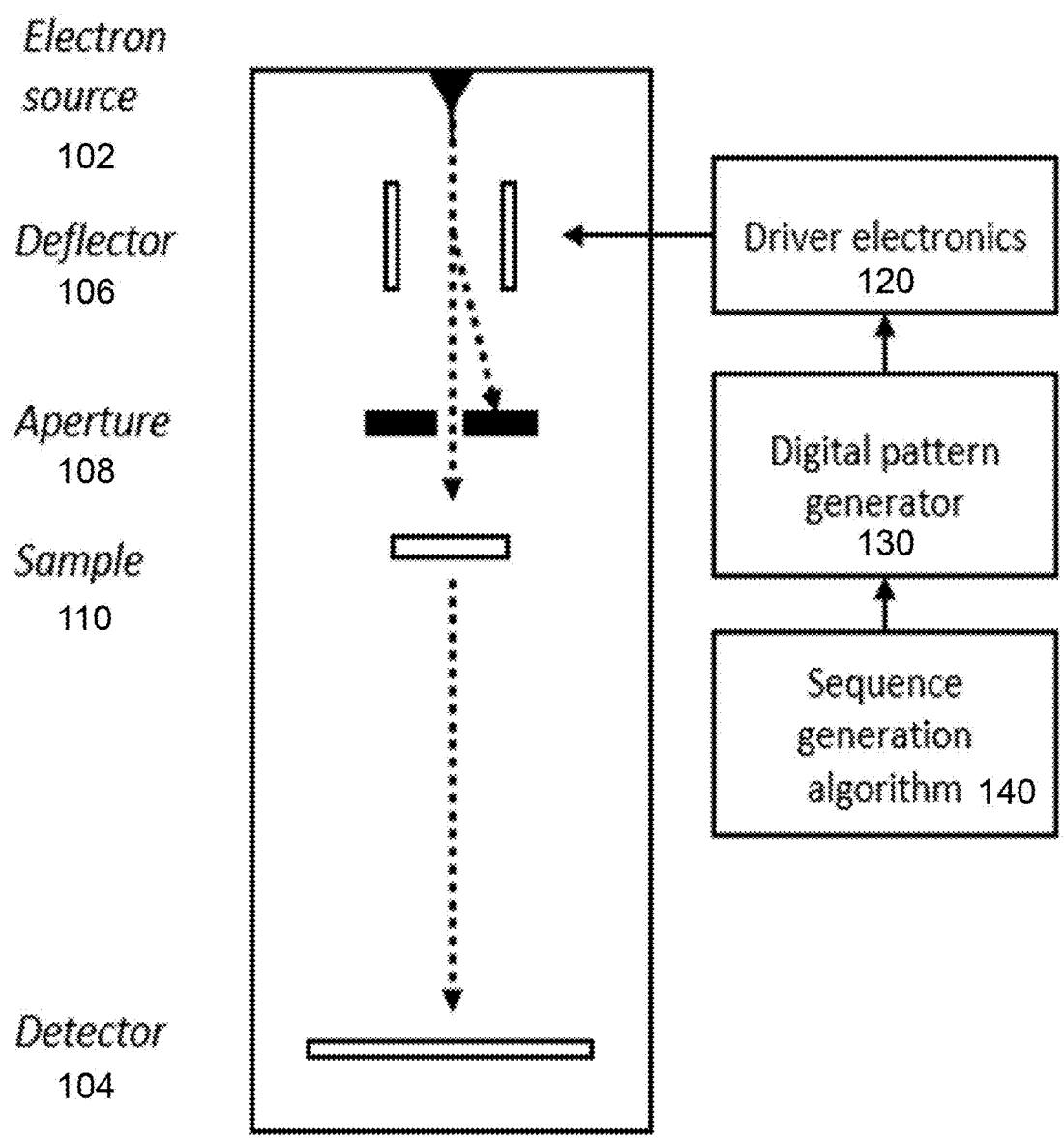
FIG. 1 shows a non-limiting example of a device comprising a deflector for delivering an electron dose waveform, in accordance with embodiments.

Methods and systems for modulating the electron dose for use in, for example, transmission electron microscopy (TEM) are described. Systems and methods of the present disclosure allow the functional form and timescale of the dose to be tailored to the dynamics of the sample in a precise and repeatable fashion. In some cases, this may be used to reduce or control the effects of the electron dose during a TEM measurement.

In some cases, the effect of the electron dose on the sample may be disadvantageous. For example, the dose may cause the sample to deform and move, or to accumulate heat or a net electric charge, each of which may lead to blurry images. In some cases, the structure of the sample may be altered such that the original structure of interest is no longer visible. In some cases, effects of the electron dose on the sample may occur at a start of the exposure. For example, samples may jump or otherwise for a time yield blurry images. In some cases, these effects may appear for a limited time after the electron beam touches them. In some cases, these effects may be reduced or disappear at a later time in the exposure. In some cases, effects of the dose at the beginning of sample collection may be disadvantageous because the sample may have less damage than may be accumulated over the course of a measurement. In some cases, effects of the dose may reduce a quality of the data. Without being limited by theory, this may be due to, for example, transient charging and/or sample motion. In some cases, effects of the dose on the sample may be mitigated by varying the electron dose slowly with time. For example, varying the dose with time may give the sample an opportunity to adjust as the dose increases or decreases. For example, effects of the dose may be mitigated by controlling the duration of brief repeated exposures.

In some cases, electron dose induced dynamics may be interesting to study. For example, nucleation and growth of nanoparticles may be induced by a high-intensity burst of the electron beam and, for example, subsequently measured at a reduced intensity. By controlling the dose rate at each stage of the process, the rate of the process under study may be adjusted for the bandwidth of the detector.

The present disclosure provides systems and devices comprising an electron source directed toward a sample area; a detector for receiving an electron signal or an electron-induced signal; and a deflector positioned between the electron source and the sample. The deflector may modulate an intensity of the electron source directed to the sample area according to an electron dose waveform. The waveform may have a continuously variable temporal profile. For example, the waveform may have a temporal profile with one or more of a non-uniform repetition rate, a non-uniform pulse width, or a non-uniform pulse shape. The deflector may apply an electric field to an electron source (e.g. an electron beam) directed at the sample area.

Unless otherwise defined, all of the technical terms used herein have the same meaning as commonly understood by one of ordinary skill in the art in the field to which this disclosure belongs.

As used in this specification and the appended claims, the singular forms "a", "an", and "the" include plural references unless the context clearly dictates otherwise. Any reference to "or" herein is intended to encompass "and/or" unless otherwise stated.

As used herein, and unless otherwise specified, the term "about" or "approximately" means an acceptable error for a particular value as determined by one of ordinary skill in the art, which depends in part on how the value is measured or determined. In some case, the term "about" or "approximately" means within 1, 2, 3, or 4 standard deviations. In some cases, the term "about" or "approximately" means within 30%, 25%, 20%, 15%, 10%, 9%, 8%, 7%, 6%, 5%, 4%, 3%, 2%, 1%, 0.5%, 0.1%, or 0.05% of a given value or range. In some cases, the term "about" a number refers to that number plus or minus 10% of that number. In some cases, the term "about" when used in the context of a range refers to that range minus 10% of its lowest value and plus 10% of its greatest value.

As noted above, methods and systems for modulating the electron dose for use in, for example, a transmission electron microscopy (TEM) image are described. Methods and systems of the present disclosure may improve upon methods which modulate an electron dose by adjustments to electron optical settings, such as beam current, convergence angle, and aperture size. In such a method, dose may not be quickly varied in time, the method may require skill, and many parameters of the system may change with the intensity which can reduce the quality of the image.

In another example, methods and systems of the present disclosure may improve upon methods which modulate an electron dose by turning the beam entirely on or off using a shutter and/or blanker not capable of operation at high frequencies such as kilohertz (kHz) or higher. For example, while the sample is not being measured, the beam may be turned off. In such an example, the dose rate may be fixed at two values (on and off).

In another example, methods and systems of the present disclosure may improve upon methods where the electron beam is turned off during certain portions of a scanning probe measurement such that the sample is sparsely measured. In the sparse measurement technique, the dose rate may not be uniformly adjusted across the entire sample and therefore the effects of high dose may not be fully controlled in all locations of the sample. Specialized computer algorithms may be used to estimate the outcome of a complete measurement, thereby potentially increasing the difficulty of the sparse measurement technique. In some cases, the algorithm may miss details which would be present in a complete measurement. In some cases, the algorithm may produce details which would not be present in a complete measurement. In the sparse measurement technique, the dose to the entire measurement region of the sample may not be varied rapidly over time.

In another example, methods and systems of the present disclosure may improve upon methods which modulate an electron dose by radio frequency pulsers which include resonators based on cavities or striplines. For example, a resonant radio frequency pulser may chop the beam into a uniform train of identical pulses at gigahertz (GHz) timescales. In such an example, the pulse trains may be restricted to specific repetition rates and low quasi-fixed duty cycles. In such an example, a resonant pulser may not execute an arbitrary waveform. In some cases, resonant pulsers may be specifically installed for a fixed acceleration voltage on transmission electron microscopes capable of operating at a variety of voltages. In such a case, pulsed operation may not be available for all possible optical settings on the transmission electron microscope.

In a somewhat related technique, laser-driven cathode illumination and/or photoemission may be used to modulate the dose. A transmission electron microscope may be configured such that electrons are emitted when laser light hits the cathode. By using a pulsed laser for this purpose, a pulsed or modulated electron beam may be created. Due to physical constraints of lasers and cathodes, this method may be of limited tuning range. Therefore, it may not execute an arbitrary waveform in the same sense as the systems and methods of the present disclosure. The photoemission method may also be much more technically challenging and costly compared to systems and methods of the present disclosure and may have a detrimental effect on the image quality, maximum beam current, or lifetime of TEM components. For example, a laser-driven photocathode may adjust the continuous current by adjusting the power output of a continuous-wave (CW) laser (e.g., a 1% to 100% power level adjustment). In some examples, a laser-driven photocathode may not change measurement parameters on the TEM, other than the photoelectron current.

FIG. 1 shows a non-limiting example of a device comprising a deflector for delivering an electron dose waveform, in accordance with embodiments. In some cases, the device is a TEM with a fast electrostatic deflector in which an electron beam originating from an electron gun or other source positioned at the top of the instrument propagates downward through a sample.

Provided herein are devices comprising an electron source 102 directed toward a sample area 110, a detector 104 for receiving an electron signal or an electron-induced signal; and a deflector 106 positioned between the electron source and the sample. In some cases, the device is a transmission electron microscope; however, deflector systems such as those disclosed herein may also be used in conjunction with other electron microscopy and electron spectroscopy applications, such as serial-section electron microscopy (ssEM), scanning electron microscopy (SEM), reflection electron microscopy (REM), scanning transmission electron microscopy (STEM), energy-dispersive X-ray spectroscopy (EDS), etc. There are instruments capable of more than one of these operating modes. There are variations in geometry such that the electron source may be on the bottom or the side of the instrument and the beam may travel upwards or horizontally.

As shown in FIG. 1, an electron source 102 may be provided. The electron source may emit electrons at a controllable acceleration voltage. The electron source may emit electrons in the direction of the sample area. The electron source may comprise an electron gun. The electron source may comprise a hot filament source which emits electrons. The electron source may comprise a field emission source which emits electrons. The electron source may comprise one or more acceleration optics. For example, the acceleration optics may comprise a cathode and an anode. The anode may comprise a controllable electrode voltage to accelerate the electrons away from the filament at a selectable voltage. The electron source may comprise a series of electron optics to shape a spatial profile of the electron source. For example, the electron source may comprise one or more electrostatic or electrodynamic lenses. In some cases, the electron source may be directed toward the sample by one or more steering deflectors. The steering deflector may or may not also be used to control the temporal profile of the electron dose waveform that arrives at the sample area.

As shown in FIG. 1, a detector 104 may be provided. The detector may receive an electron signal that has propagated through the sample area or an electron-induced signal from the sample area. The detector may be a two-dimensional detector array. A two-dimensional detector array may in some instances comprise a single detector, e.g., a CCD or CMOS image sensor, comprising a two dimensional array of individual pixels or groupings of pixels, or in some instances may refer to a two dimensional array of individual detectors, e.g., a two-dimensional array of CCD or CMOS image sensors. In some instances, a two-dimensional detector array may comprise a two dimensional array of individual detectors that include a combination of CMOS image sensors, CCD image sensors, dark-field STEM detectors, Faraday cup sensors, or other types of detectors. In some instances, the detector may comprise an energy dispersive X-ray spectrometer (EDS) or an energy dispersive X-ray (EDS) detector. An EDS detector may measure an electron-induced signal. For example, an EDS detector may measure x-rays which are backscattered as an electron beam hits the sample area. In some cases, X-rays may be generated when an electron beam hits and interacts with a sample as it passes through a sample area.

Examples of suitable detectors for use in the disclosed methods and systems include, but are not limited to, charge-coupled device (CCD) image sensors and cameras that include a layer that emits photons when struck by an electron, complementary metal oxide semiconductor (CMOS) image sensors and cameras that include a layer that emits photons when struck by an electron, electron direct detection (EDD) image sensors and cameras (e.g., CCD, CMOS, or hybrid-pixel image sensors which have been designed to detect electrons directly), time-of-flight (ToF) image sensors and cameras, dark-field STEM detectors, Faraday cups, quad photodiodes, annular dark field detectors, bright field detectors, universal detectors, or any combination thereof.

As shown in FIG. 1, a deflector 106 may be provided. A deflector may be positioned between the electron source and the sample. A deflector may comprise an embodiment, variation or example of the deflector described herein with respect to FIG. 2. Systems and methods of the present disclosure may use a fast electrostatic deflector. The fast electrostatic deflector may be placed after the source of the electron beam in a TEM. In some examples, when no voltage is applied, the electron beam may transmit normally, and when a voltage is applied, the electrons may be deflected at an angle such that they do not pass through an aperture, and they do not reach the sample. In this way, the beam may be rapidly turned on and off. In some cases, a beam may propagate through an aperture 108. The voltage applied at a deflector may control whether the electron beam propagates through the aperture or is blocked by the aperture.

The deflector 106 may modulate an intensity of the electron source directed to the sample area. The modulation may be achieved through one or a combination of the following: pulse width modulation (PWM), pulse density modulation (PDM), or delta modulation (DM). The modulation of the electron source by the deflector may relate to an electron dose waveform. The waveform provided may modulate an amount of electrons (e.g. a dose) which arrives at the sample area. In some cases, the waveform may determine a temporal profile of an average dose at the sample area. In some examples, a waveform which determines a temporal profile of the average dose may be provided. The temporal profile of the average dose may be indicated by the user. The indicated temporal profile may be converted to a waveform. The conversion to a waveform may be performed or aided by a processor comprising instruction as disclosed herein. The waveform may be an on-off waveform which varies the average dose with time. The waveform may be amplified to an operating voltage and applied to a fast electrostatic deflector.

Without being limited by theory, PDM and/or DM modulation schemes may balance goals of minimization the number of on-off transitions with the goal of creation of a smooth time-varying intensity. On-off transitions may be disadvantageous in at least some instances: first, they may consume power which may limit the maximum time resolution of a dose waveform; second, the intermediate state during the transition between on and off may reduce data quality. PDM and/or DM systems may inherently leverage non-uniform pulse durations. For example, in a PDM scheme the density of pulses with respect to time may be varied according a reference function, such as for example a periodic function. For example, in a DM scheme, the pulse duration with respect to time may be varied according to a reference function, such as for example a periodic function.

The electron dose waveform may have an arbitrarily defined temporal profile. An arbitrarily defined electron dose profile may be a profile that is not dictated by a regularly periodic function. Regularly periodic functions may include pulse patterns or regular pulse patterns, e.g., square waves, sine waves, or regularly repeating pulses, and aperiodic functions may include ramp pules, Gaussians, Lorentzians, exponential rises, exponential decays, and haversines. An arbitrarily defined electron dose waveform may be an electron dose waveform which does not have a regular pulse width or does not have a regular repetition rate or both. An arbitrarily defined electron dose waveform may be an electron dose waveform which has a selectable non-regular pulse width or has a selectable non-regular repetition rate or both.

In some cases, an arbitrarily defined electron dose profile may comprise a dose profile with a series of points (e.g., waypoints). The waveform may be interpolated from the series of points. The series of waypoints are individually or collectively selectable to construct an arbitrarily defined temporal profile. In some cases, the arbitrarily defined temporal profile is indicated by a user. In some cases, a user may provide a function and a series of waypoints may be generated. In some cases, a user may individually move a waypoint or set of waypoints to change the waveform. In some cases, the electron dose waveform is aperiodic.

In some cases, the temporal profile comprises a temporal resolution. In some cases, the temporal resolution is defined as the distance between waypoints in the arbitrarily defined temporal profile. The temporal resolution may be less about than about 100 ns (nanoseconds). The temporal resolution may be less than about 50 ns. The temporal resolution may be less than about 10 ns. The temporal resolution may be optionally, less than about 100 ns, about 50 ns, about 20 ns, about 10 ns, about 5 ns, about 1 ns, about 500 ps (picoseconds), about 250 ps, about 100 ps, about 50 ps, about 20 ps, about 10 ps, or lower. Any of the lower and upper values described in this paragraph may be combined to form a range included within the present disclosure, for example, the temporal resolution may be within a range from about 100 ns to about 5 ns, from about 50 ns to about 1 ns, or from about 20 ns to about 1 ns.

In some cases, a series of waypoints comprises greater than about 1000 waypoints. In some cases, a series of waypoints comprises greater than about 10,000 waypoints. In some cases, the series of waypoints comprises greater than about 100,000 waypoints. In some cases, the series of waypoints comprises greater than about 1,000,000 waypoints or more. In some cases, the series of waypoints comprises between about 10,000 waypoints and about 1,000,000 waypoints. In some cases, the series of waypoints is repeated a number of times to form a series of series. In some cases, the series is repeated about 10 times, about 100 times, about 1,000 times, about 10,000, about 100,000 times, about 1,000,000 times or more. Any of the lower and upper values described in this paragraph may be combined to form a range included within the present disclosure, for example, the number of repetitions in a time series may be within a range from about 10 to about 10,000, from about 1 to about 100, or from about 1 to about 1,000.

In some cases, the waveform may comprise multiple pulses within a series. For example, the electron dose waveform may comprise a pump and a probe pulse. A pump-probe experiment may be used to measure time dependent processes within the sample. In some cases, a pump pulse and a probe pulse may have the same shape, e.g. two Gaussians, two Lorentzians, two square waves, etc. In some cases, the shape of the two pulses may be different, for example, an exponential decay and a Gaussian, or any two other pulse types described herein. The series of pulses may be repeated a number of times to form a series of series. In some cases, the series is repeated about 10 times, about 100 times, about 1,000 times, about 10,000, about 100,000 times, about 1,000,000 times or more. Any of the lower and upper values described in this paragraph may be combined to form a range included within the present disclosure, for example, the number of repetitions in a time series may be within a range from about 10 to about 10,000, from about 1 to about 100, or from about 1 to about 1,000.

In some cases, a repetition rate of the series of electron dose waveforms is greater than about 1 kHz, about 5 kHz, about 10 kHz, about 20 kHz, about 50 kHz, about 100 kHz, or more. In some cases, a repetition rate of the series of electron dose waveforms is less than about 1000 MHz, about 500 MHz, about 200 MHz, about 100 MHz, or less. Any of the lower and upper values described in this paragraph may be combined to form a range included within the present disclosure, for example, a repetition rate of the series of electron dose waveforms may be from about 500 kHz to about 1 MHz, from about 100 kHz to about 10 MHz, or from about 10 kHz to about 100 MHz.

In some cases, a minimum repetition period of the series of electron dose waveforms may be optionally, less than about 100 ms (milliseconds), about 50 ms, about 20 ms, about 10 ms, about 5 ms, about 1 μs (microseconds), about 500 μs, about 250 μs, about 100 μs, about 50 μs, about 20 μs, about 10 μs, or lower. Any of the lower and upper values described in this paragraph may be combined to form a range included within the present disclosure, for example, the minimum repetition period may be within a range from about 1 ms to about 1 µs, from about 100 µs to about 1 pts, or from about 20 ns to about 1 µs.

The electron dose waveform may have a continuously variable temporal profile. For example, a user may determine a waveform and later may alter a waveform. An alteration may comprise changing a location of one or more waypoints, changing a time between repetitions of a series of waveforms, changing a number of repetitions, etc. In some cases, the width of pulses of a square wave may be changed dynamically. For example, a pulse width of a series of square waves may be aperiodic or have a continuously adjustable periodicity.

In some examples, the user may choose between an arbitrarily defined temporal profile and a regularly periodic function. For example, the deflector may provide pulse patterns or regular pulse patterns, e.g., square waves, sine waves, or TTL pulses, and may include regularly repeating pulses, ramp pules, Gaussians, Lorentzians, exponential rises, exponential decays, and haversines, to the deflector. In some cases, the electron dose waveform is periodic.

In some cases, a transition between a high deflector voltage and a low deflector voltage may be characterized by a transition time. For example, a transition time between a high voltage and a low voltage is less than about 50 ns, defined as a sum of a ringing time plus a slope time. In some cases, a transition time between a high voltage and a low voltage is less than about 1 microsecond, about 500 ns, about 250 ns, about 100 ns, about 50 ns, about 20 ns, about 10 ns, about 5 ns, or less.

In some cases, a transition between a high deflector voltage and a low deflector voltage may be characterized by a transition time. For example, a transition time between a high voltage and a low voltage is less than about 10 ns, defined as a slope time from about 10% to about 90% a transition voltage. In some cases, a transition time between a high voltage and a low voltage is less than about 1 microsecond, about 500 ns, about 250 ns, about 100 ns, about 50 ns, about 20 ns, about 10 ns, about 5 ns, about 2 ns, about 1 ns or less.

In some cases, the electron dose waveform is characterized by a shortest exposure time. For example, the electron dose waveform may comprise a shortest exposure time of about 100 ns. In some cases, the shortest exposure time is less than about 1 microsecond, about 500 ns, about 250 ns, about 100 ns, about 50 ns, about 20 ns, about 10 ns, about 5 ns, about 2 ns, about 1 ns, or less. Any of the lower and upper values described in this paragraph may be combined to form a range included within the present disclosure, for example, the shortest exposure time may be within a range from about 500 ns to about 1 ns, about 100 ns to about 5 ns, from about 50 ns to about 1 ns, or from about 20 ns to about 1 ns.

In some cases, the temporal profile comprises a pulse width. The minimum pulse width may be less about than about 100 ns (nanoseconds). The minimum pulse width may be less than about 50 ns. The temporal resolution may be less than about 10 ns. The minimum pulse width may be optionally, less than about 100 ns, about 50 ns, about 20 ns, about 10 ns, about 5 ns, about 1 ns, about 500 ps (picoseconds), about 250 ps, about 100 ps, about 50 ps, about 20 ps, about 10 ps, or lower. Any of the lower and upper values described in this paragraph may be combined to form a range included within the present disclosure, for example, the minimum pulse width may be within a range from about 100 ns to about 5 ns, from about 50 ns to about 1 ns, or from about 20 ns to about 1 ns.

In some cases, the temporal profile comprises a fastest pulse duration. The fastest pulse duration may be less about than about 200 ns (nanoseconds). The fastest pulse duration may be less than about 100 ns. The temporal resolution may be less than about 50 ns. The fastest pulse duration may be optionally, less than about 100 ns, about 50 ns, about 20 ns, about 10 ns, about 5 ns, about 1 ns, about 500 ps (picoseconds), about 250 ps, about 100 ps, about 50 ps, about 20 ps, about 10 ps, or lower. Any of the lower and upper values described in this paragraph may be combined to form a range included within the present disclosure, for example, the fastest pulse duration may be within a range from about 100 ns to about 5 ns, from about 50 ns to about 1 ns, or from about 20 ns to about 1 ns.

In some examples, dose modulation may be implemented using a fast electrostatic shutter. The electron beam may be rapidly blanked at fixed repetition rate (kHz-MHz) such that the average dose is reduced. In this example, the peak dose rate may not change. When the average dose rate or repetition frequency is changed, the settings may take effect after a delay. In some cases, a delay may be a non-repeatable delay, a regularly repeatable delay, or an irregularly repeated delay.

A repetition rate of the electron dose waveform in a shutter mode may be within a range from about 500 kHz (kilohertz) to about 1 MHz (megahertz) at a voltage of the electron beam within a range from about 80 kV (kilovolts) to about 300 kV. A repetition rate may be within a range from about 10 kHz to about 100 MHz at a voltage of the electron beam within a range from about 80 kV to about 300 kV. A repetition rate may be within a range from about 500 kHz to about 1 MHz at a voltage of the electron beam within a range from about 0.5 kV to about 1,000 kV.

In some cases, a repetition rate of the electron dose waveform is greater than about 1 kHz, about 5 kHz, about 10 kHz, about 20 kHz, about 50 kHz, about 100 kHz, or more. In some cases, a repetition rate of the electron dose waveform is less than about 1000 MHz, about 500 MHz, about 200 MHz, about 100 MHz, or less. Any of the lower and upper values described in this paragraph may be combined to form a range included within the present disclosure, for example, from about 500 kHz to about 1 MHz, from about 100 kHz to about 10 MHz, or from about 10 kHz to about 100 MHz.

As shown in FIG. 1, the device may comprise drive electronics 120, digital pattern generator 130, and sequence generation algorithm 140. A sequence generation algorithm may comprise an embodiment, variation or example of the deflector described herein with respect to FIG. 3. For example, a pattern generator may produce an electrical signal representative of the electron dose waveform. A driver electronics may receive the electrical signal from the pattern generator and supply a voltage comprising the electron dose waveform to the deflector. A sequence generation algorithm may receive an indication of an electron dose waveform to a user and deliver the indication to the pattern generator to produce an electrical signal.

Figure 2:
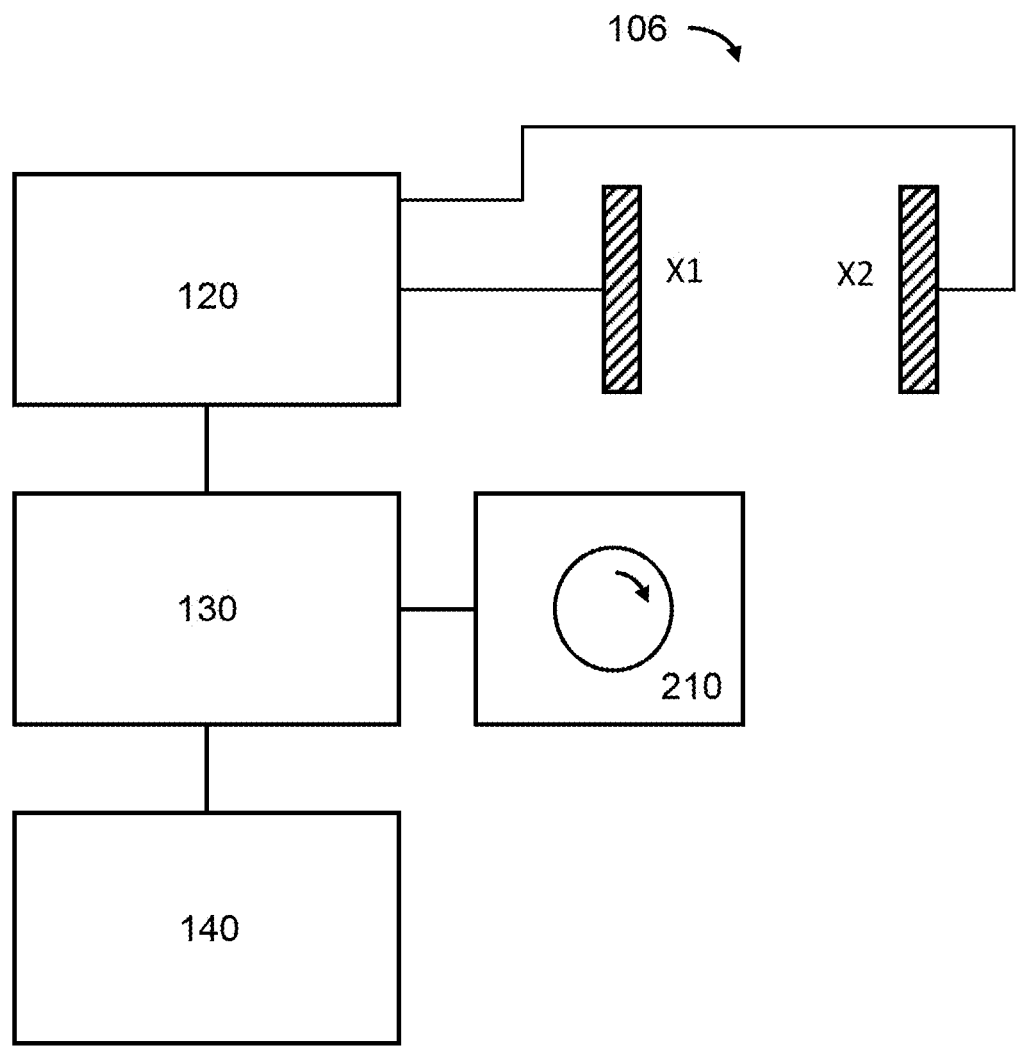
FIG. 2 shows an example of a deflector, in accordance with embodiments.

FIG. 2 shows an example of deflector 106, in accordance with embodiments. The deflector may comprise one or more electrodes. The deflector may comprise two or more pairs of electrodes. Each pair of electrodes may move electrons in a different direction. In some examples, the various pairs of electrodes may move electrons in a different axis. In the example shown, the detector has two electrodes X1 and X2 which are shaped like plates.

In some cases, the deflector comprises a driving electrode and an electrode at a fixed voltage. In some cases, the deflector comprises a driving electrode near a portion of the microscope, which is held at a fixed voltage and which acts as a second electrode at a fixed voltage. In some instances, the portion of the microscope is a grounded beam tube. In some instances, the magnitude of the driving voltage may range from about 0 volts to about 10 kilovolts (kV). In some instances, the magnitude of the driving voltage may be at least 0 volts, at least 10 volts, at least 100 volts, at least 500 volts, at least 1,000 volts, at least 5 kV, or at least 10 kV. In some instances, the magnitude of the driving voltage may be at most 10 kV, at most 5 kV, at most 1,000 volts, at most 500 volts, at most 100 volts, at most 10 volts, or about 0 volts. In some cases, the driving voltage is within a range from about +/−100 to about +/−200 Volts (V). Any of the lower and upper values described in this paragraph may be combined to form a range included within the present disclosure, for example, the driving voltage may be within a range from about +/−1 to about +/−2,000 V, about +/−10 to about +/−1,000 V, about +/−20 to about +/−500 V, or about +/−50 to about +/−500 V.

In some cases, the deflector comprises two driving electrodes. For example, the two driving electrodes may have opposite voltages. The two driving electrodes may have equal and opposite voltages or unequal voltages. In some instances, the magnitude of the driving voltage may range from about 0 volts to about 10 kV. In some instances, the magnitude of the driving voltage may be at least 0 volts, at least 10 volts, at least 100 volts, at least 500 volts, at least 1,000 volts, at least 5 kV, or at least 10 kV. In some instances, the magnitude of the driving voltage may be at most 10 kV, at most 5 kV, at most 1,000 volts, at most 500 volts, at most 100 volts, at most 10 volts, or about 0 volts. In some cases, the driving voltage is within a range from about +/−100 to about +/−200 Volts (V). Any of the lower and upper values described in this paragraph may be combined to form a range included within the present disclosure, for example, the driving voltage may be within a range from about +/−1 to about +/−2,000 V, about +/−10 to about +/−1,000 V, about +/−20 to about +/−500 V, or about +/−50 to about +/−500 V.

As shown, the deflector may be part of a beam deflection system. For example, the beam deflection system may comprise drive electronics 120, digital pattern generator 130, and sequence generation algorithm 140. A sequence generation algorithm may comprise an embodiment, variation or example of the deflector described herein with respect to FIG. 3. The sequence generation algorithm may provide a digital signal to the digital pattern generator.

A device may comprise driving electronics 120. The driving electronics receive an electrical signal from the digital pattern generator and output a voltage to drive the electrodes of the deflectors. The driving electronics may comprise a digital power amplifier. The digital power amplifier may mirror the incoming digital pattern at the deflector plates. The driving electronics may facilitate flexibility of the waveform in the PWM modulation scheme. The driving electronics may comprise analog signal conditioning components, e.g. low pass filter, high pass filter, DC offset, grounding, shielding, etc. The driving electronics may comprise separate channels for driving the electrodes.

The drive electronics may provide a fast transition time. In some cases, a transition between a high deflector voltage and a low deflector voltage may be characterized by a transition time. For example, a transition time between a high voltage and a low voltage is less than about 50 ns, defined as a sum of a ringing time plus a slope time. In some cases, a transition time between a high voltage and a low voltage is less than about 1 microsecond, about 500 ns, about 250 ns, about 100 ns, about 50 ns, about 20 ns, about 10 ns, about 5 ns, or less. In some cases, a transition between a high deflector voltage and a low deflector voltage may be characterized by a transition time. For example, a transition time between a high voltage and a low voltage is less than about 10 ns, defined as a slope time from about 10% to about 90% a transition voltage. In some cases, a transition time between a high voltage and a low voltage is less than about 1 microsecond, about 500 ns, about 250 ns, about 100 ns, about 50 ns, about 20 ns, about 10 ns, about 5 ns, about 2 ns, about 1 ns or less.

The drive electronics may provide a sustained high frequency. For example, a frequency provided by the drive electronics may be within a range from about 500 kHz (kilohertz) to about 1 MHz (megahertz) at a voltage of the electron beam within a range from about 80 kV to about 300 kV. A frequency provided by the drive electronics may be within a range from about 10 kHz to about 100 MHz at a voltage of the electron beam within a range from about 80 kV to about 300 kV. A frequency provided by the drive electronics may be within a range from about 500 kHz to about 1 MHz at a voltage of the electron beam within a range from about 0.5 kV to about 1,000 kV.

In some cases, a frequency provided by the drive electronics is greater than about 1 kHz, about 5 kHz, about 10 kHz, about 20 kHz, about 50 kHz, about 100 kHz, or more. In some cases, a frequency provided by the drive electronics less than about 1000 MHz, about 500 MHz, about 200 MHz, about 100 MHz, or less. Any of the lower and upper values described in this paragraph may be combined to form a range included within the present disclosure, for example, from about 500 kHz to about 1 MHz, from about 100 kHz to about 10 MHz, or from about 10 kHz to about 100 MHz.

A device may comprise a pattern generator 130. The pattern generator may be an analog or a digital pattern generator. The digital pattern generator may take the indication of the waveform from the algorithm and produce an electrical signal representative of the electron dose waveform. The signal representative of the electron dose waveform may be a lower voltage signal than is provided to the deflectors by the driving electronics. The digital pattern generator may receive various parameters relating to the shape of the waveform. The parameters together may comprise an indication of a waveform. The various parameters may comprise an indication of any of the properties of the waveform as disclosed herein. The digital pattern generator may receive synchronization signals from other portions of the microscope as disclosed herein. The pattern generator may be programmable. The pattern generator may be integrated with other sensors and workflows within the microscope, such as described herein with respect to sequence generation algorithms. The digital pattern generator may comprise a pulse width modulator. The digital pattern generator may generate a DM, PWM, and/or PDM modulation scheme. The digital pattern generator may comprise a digital to analog (DAC) converter or an analog to digital converter (ADC). In some cases, the digital pattern generator comprises a DAC and/or ADC to control one or more components of the microscope for example to synchronize it with the dose waveform.

In some cases, the electron dose waveform may modulate an average intensity of the electron source directed toward the sample area. In some cases, the average intensity may be modulated substantially without change to other image conditions. For example, a temporal profile of the waveform may be set, and an alignment of the instrument may be set, but it may be desirable to change an average intensity of the electron dose.

As shown, knob 210 may be connected to the digital pattern generator. Knob 210 may be a physical or virtual knob to adjust the average intensity. In some cases, the average intensity is controllable independently of a driving voltage of the electron source. For example, the average intensity may comprise adjusting a time delay between electron pulses, narrowing of electron pulse duration, or a direct adjustment of the amplitude of the waveform.

In some cases, the average intensity is continuously variable across a range from 0 to 100% dose transmission or 0 to 100% dose attenuation. The dose attenuation (also referred to as the attenuation rate) may be expressed as a ratio a/b, where a is the pulse width and b is the period of the electron dose waveform. The dose attenuation may be expressed as a percentage. The dose transmission may be related to the dose attenuation by the relation: dose transmission=100%–dose attenuation expressed as a percentage.

In some cases, the average intensity is continuously variable across a range from 0 to 100% dose transmission or 0 to 100% dose attenuation in increments of about 30%, about 25%, about 20%, about 15%, about 10%, about 9%, about 8%, about 7%, about 6%, about 5%, about 4%, about 3%, about 2%, about 1%, about 0.5%, about 0.1%, about 0.05%, about 0.01%, about 0.001% or less. Any of the lower and upper values described in this paragraph may be combined to form a range included within the present disclosure, for example, the dose attenuation may be varied in increments within a range from about 30% to about 0.01%, from about 10% to about 0.1%, from about 30% to about 1%, from about 10% to about 0.01%, etc.

The ratio (a/b) of the pulse width and the period may be varied over the time. For example, it may be varied over the course of 20 seconds. The ratio may be varied over a time less than about 100 s (seconds), about 50 s, about 20 s, about 10 s, about 5 s, about 1 s, about 500 ms, about 250 ms, about 100 ms, about 50 ms, about 20 ms, about 10 ms, or less. Any of the lower and upper values described in this paragraph may be combined to form a range included within the present disclosure, for example, the ratio may be varied over time within a range from about 100 s to about 1 ms, from about 100 s to about 1 s, or from about 50 s to about 1 s, etc.

Figure 3:
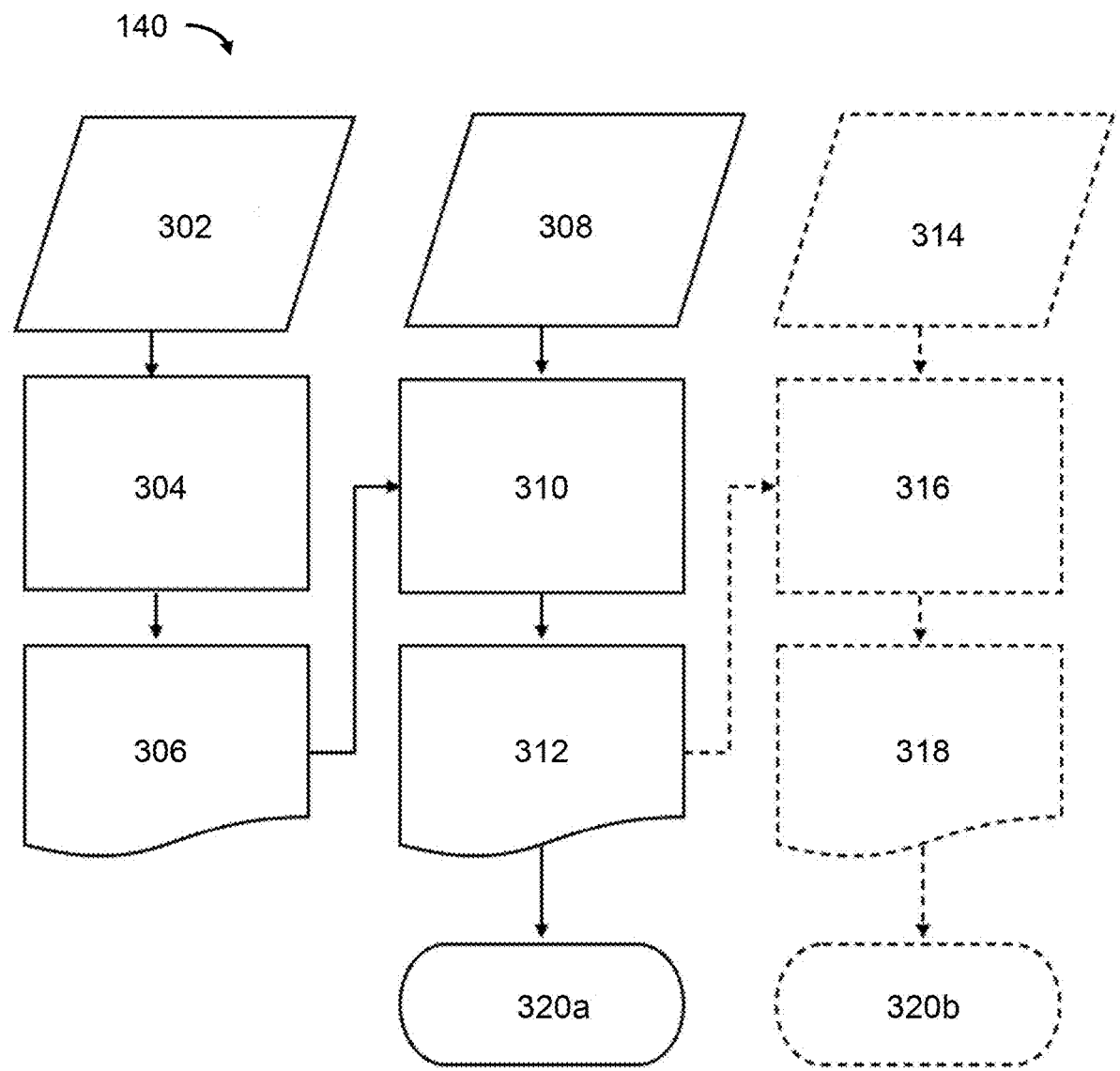
FIG. 3 shows a schematic of a computer implemented method for modulating a dose in a transmission electron microscope image, in accordance with embodiments.

FIG. 3 shows a schematic of a computer- or processor-implemented method for modulating a dose in a transmission electron microscope image, in accordance with embodiments. The device may comprise one or more computer processors, such as, for example, those described herein with respect to the section Processors and Computers. The one or more computer processors may comprise instructions that when executed are configured to implement the method described herein.

For example, a processor may receive an indication of an electron dose waveform, e.g., dose waveform 302. A processor may deliver the indication to the pattern generator within the beam deflection system 320a, 320b. The processor may also comprise instructions including the steps of a method to generate a waveform. The processor may also comprise instructions including the steps of a method to adjust a waveform in response to various parameters. Sequence generation algorithm 140 may comprise one or more of components: 304, 306, 308, 310, 312, 314, 316, and 318.

For example, a shape of the electron dose waveform may be adjusted according to one or more parameters. It may be advantageous in some cases to continuously adjust the characteristics of the waveform, e.g., a temporal profile of the waveform, according to a property of the image, the deflector, the driver, the detector, or the waveform, in order to improve measurement quality or respond to external changes in the instrument or both. Automatic updating of a temporal profile of a waveform may simplify user experience by correcting for changes in measurement conditions or by automatically inputting improvement measurement settings.

For example, the one or more parameters may comprise information about one or more of a property of an image from the detector, a property of the deflector, a property of the driver electronics, a property of the detector, and the indication of the electron dose waveform. In some cases, the one or more parameters comprise an indication of a minimum, a maximum, or a fixed value for a pulse width or a pulse repetition rate of the electron dose waveform. For example, the waveform may be adjusted such that an indication of waveform by a user may not exceed functional capabilities of the device. In some cases, the indication of the waveform may not exceed fixed parameters of the waveform set by a user, e.g. so that a ramp voltage does not exceed a set level.

In some cases, the one or more parameters comprises a timing constraint of the deflector, the driver electronics, or the pattern generator. For example, a deflector may be timed such that electrons may pass to a detector during a collection interval of a detector. For example, a pattern generator of the deflector may be timed such that electrons pass to a detector during a collection interval. For example, the deflection may be synchronized with a read-out from a detector over a prolonged period of time. A period of time may be, for example, a data acquisition period of up to 8 hours, or more. The timing of the deflector and the detector may be such that the timing accuracy for the two processes meets a defined performance specification, for example, where the synchronization of the two processes is accurate to within 50 msec, or better.

In some cases, the one or more parameters comprise a characteristic timescale of a sample or a process within the sample. For example, the electron dose may cause the sample to deform and move, or to accumulate heat or a net electric charge, each of which may lead to blurry images. In some cases, the structure of the sample may be altered such that the original structure of interest is no longer visible. Each of these processes may have characteristic timescales. For example, effects of the electron dose on the sample may occur at a start of the exposure or may appear for a limited time after the electron beam initially touches the sample. These effects may be reduced or disappear at a later time in the exposure. Accordingly, electron dose waveform may be automatically adjusted, such as by varying the electron dose slowly with time. Varying the dose with time may give the sample an opportunity to adjust as the dose increases or decreases. As another example, effects of the dose may be mitigated by controlling the duration of brief repeated exposures.

In some cases, the one or more parameters comprise a time-dependent voltage bias or temperature. For example, a voltage bias or temperature may be applied to the sample by the sample holder, and this may change the optimal dose waveform. For example, the electron dose may cause the sample to accumulate heat or a net electric charge, each of which may lead to blurry images. For example, a temperature of the sample or instrument may drift, and the waveform may be adjusted to respond. The waveform may adapt to raise or lower average dose to limit induced voltage or current changes or respond to changes in signal or sample based on the heat or charge variation.

In some cases, the one or more parameters comprise a dose rate or a timing consideration of the detector. For example, a deflector may be timed such that electrons may pass to a detector during a collection interval of a detector. For example, the waveform may be synchronized with a read-out from a detector over a prolonged period of time. A period of time may be, for example, a data acquisition period of up to 8 hours, or more. The timing of the waveform and the detector may be such that the timing accuracy for the two processes meets a defined performance specification, for example, where the synchronization of the two processes is accurate to within 50 ms, or better.

In some cases, the one or more parameters comprise an indication of a data signal quality from a collected or a real-time measurement. In some cases, the one or more parameters comprise an indication an effect of the intensity of the electron dose waveform on a sample from a collected or a real-time measurement. In some cases, effects of the dose may reduce a quality of the data. Without being limited by theory, this may be due to, for example, transient charging and/or sample motion. In some case, it may be advantageous to automatically adjust one or more parameters of the electron dose in response to a real-time image.

In some cases, the indication of the waveform from the user may be input into waveform generator 304. The indication of the waveform may be input to create a preliminary waveform 306.

In some cases, the preliminary waveform 304 may be adjusted according to one or more constraints 308. The constraints may comprise an indication of a minimum, a maximum or a fixed value for a pulse width or a pulse repetition rate of the electron dose waveform. In this way, an indication of waveform by a user may not exceed functional capabilities of the device. In some cases, the indication of the waveform may not exceed fixed parameters of the waveform set by a user, e.g., so that a ramp voltage does not exceed a set level. In some cases, a constraint may comprise a timing constraint of the deflector, the driver electronics, or the pattern generator. In this way, an indication of waveform by a user may not exceed functional capabilities of the device. In some cases, a constraint may comprise a characteristic timescale of a sample or a process within the sample. For example, a user may know a bleaching time or a sample destruction time based on an understanding of the sample or process within a sample. The waveform may be automatically adapted to limit average exposure to limit such a process. A constraint may comprise a timing of the electron dose waveform relative to a collection time of the detector, a location of one or more sub-portions of the detector, an arrival time of a stimulus to the sample area, or a change in an electron-optical condition of the device.

The one or more constraints 308 may be used to create an updated waveform 312 using waveform generator 310. In some cases, the updated waveform may be delivered to the pattern generator within the beam deflection system 320a. The updated waveform may comprise an indication of the waveform to be delivered to the pattern generator. While FIG. 3 shows the use of constraints 308, in some cases constraints may not be used. For example, preliminary waveform 306 may be fed directly into waveform generator 316, with or without the use of real time sensor information.

In some cases, the electron dose waveform may be adjusted according to one or more parameters in response to real-time sensor information 314. The real time sensor information may comprise a time-dependent voltage bias or temperature. For example, a temperature of the sample or instrument may drift, and the waveform may be adjusted to respond. For example, a waveform may be adjusted for a drift in the electron acceleration voltage or a charging of the sample or a stray field. The real time sensor information may comprise a dose rate or a timing consideration of the detector. For example, a waveform may be modified if a dose rate of the detector begins to exceed detector threshold. For example, a waveform may be modified if it exceeds a temporal response time of the detector. The real time sensor information may comprise an indication of a data signal quality from a collected or a real-time measurement. The real time sensor information may comprise an indication an effect of the intensity of the electron dose waveform on a sample from a collected or a real-time measurement. For example, if the sample is beginning to lose signal a waveform may be modified to increase intensity to raise signal. Real time sensor information may comprise a timing of the electron dose waveform relative to a collection time of the detector, a location of one or more sub-portions of the detector, an arrival time of a stimulus to the sample area, or a change in an electron-optical condition of the device.

The real time sensor information 314 may be used to create a second updated waveform 318 using waveform generator 316. In some cases, the second updated waveform may be delivered to the pattern generator within the beam deflection system 320b. The updated waveform may comprise an indication of the waveform to be delivered to the pattern generator.

In some cases, the real time sensor information may be used to create a third updated waveform, a fourth updated waveform, or more. The real time sensor information may be repeatedly fed back into waveform generator 316. For example, the real time sensor information may be used to update the waveform every 10 seconds, every 1 second, every 100 ms, every 10 ms, every 1 ms, every 100 ns, every 10 ns, every 1 ns, or less. The waveform generator may be updated in substantially real time. In some cases, the real time sensor information may be directed to the beam deflection system 320b.

Figure 4:
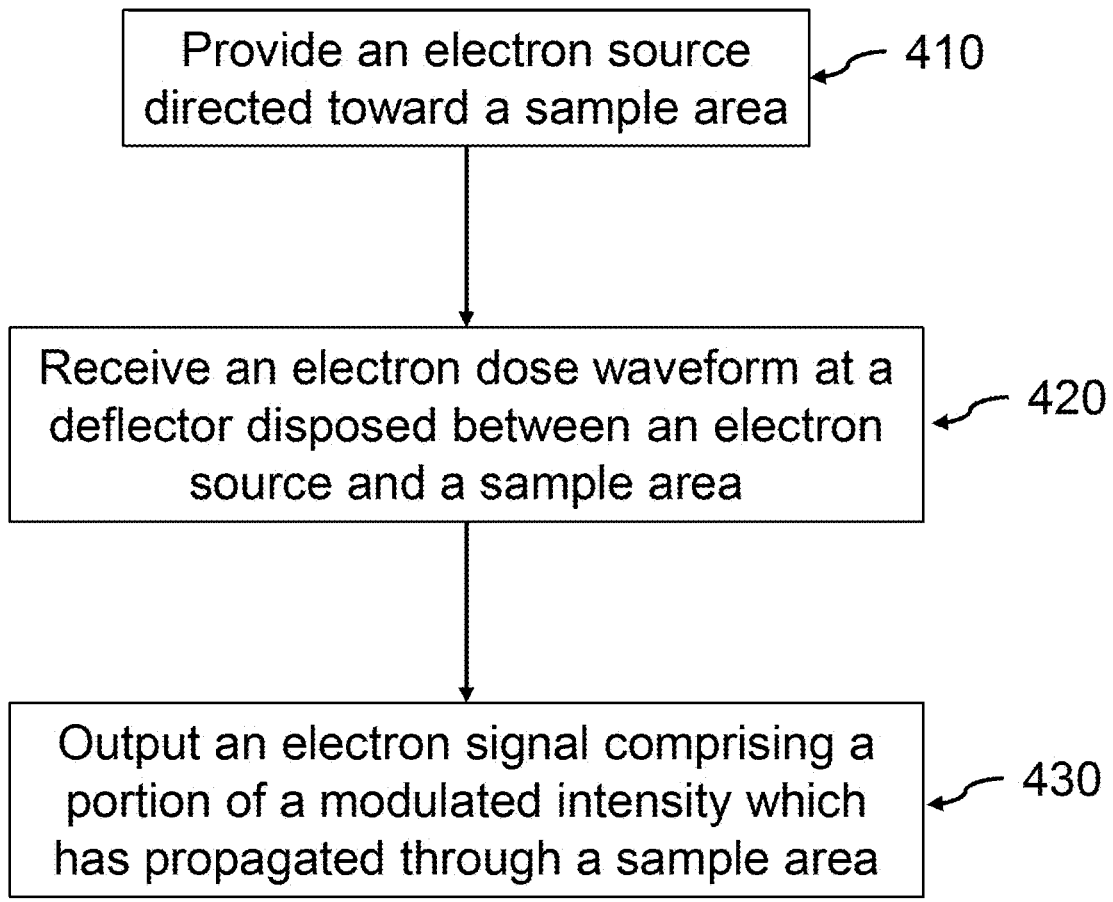
FIG. 4 shows a schematic of a method for modulating a dose in an electron microscope image, in accordance with embodiments.

FIG. 4 shows a schematic of a method for modulating a dose in an electron microscope image, in accordance with embodiments. At an operation 410, the method 400 may comprise providing an electron source directed toward a sample area. The electron source may comprise source 102 of FIG. 1. The sample area may comprise sample area 110 of FIG. 1.

At an operation 420, the method 400 may comprise receiving an electron dose waveform at a deflector disposed between an electron source and a sample area. The deflector may comprise deflector 106 of FIG. 1. The electron dose waveform may modulate an intensity of the electron source directed to the sample area. The electron dose waveform may comprise any of the waveforms, included any or all variable parameters as disclosed herein. The electron dose waveform may comprise any of the characteristics disclosed herein with respect to FIG. 1. The electron dose waveform may be generated by any method herein such as those described with respect to FIG. 3.

For example, the modulation of the electron source by the deflector may relate to an electron dose waveform. The waveform provided may modulate an amount of electrons (e.g., a dose) which arrives at the sample area. In some cases, the waveform may determine a temporal profile of an average dose at the sample area. In some examples, a waveform which determines a temporal profile of the average dose may be provided.

In some cases, method 400 further comprises receiving an indication of a temporal profile of the average dose from a user. The indicated temporal profile may be converted to a waveform. The conversion to a waveform may be performed or aided by a processor comprising instruction as disclosed herein. The waveform may be an on-off waveform which varies the average dose with time. The waveform may be amplified to an operating voltage and applied to a fast electrostatic deflector.

The electron dose waveform may have an arbitrarily defined temporal profile. An arbitrarily defined electron dose profile may be a profile that is not dictated by a regularly periodic function. Regularly periodic functions may include pulse patterns or regular pulse patterns, e.g., square waves, sine waves, or regularly repeating pulses, and aperiodic functions may include ramp pules, Gaussians, Lorentzians, exponential rises, exponential decays, and haversines. An arbitrarily defined electron dose waveform may be an electron dose waveform which does not have a regular pulse width or does not have a regular repetition rate or both. An arbitrarily defined electron dose waveform may be an electron dose waveform which has a selectable non-regular pulse width or has a selectable non-regular repetition rate or both. An arbitrarily defined temporal profile may be a temporal profile that is determined an arbitrarily defined waveform. The arbitrary waveform may be generated or input by a user. In some cases, method 400 comprises receiving an indication of a non-regular pulse width or a selection of a non-regular pulse width from a user.

In some cases, an arbitrarily defined electron dose profile may comprise a dose profile with a series of points (e.g., waypoints). The waveform may be interpolated from the series of points. The series of waypoints are individually or collectively selectable to construct an arbitrarily defined temporal profile. In some cases, method 400 further comprises receiving an indication of the arbitrarily defined temporal profile from a user. In some cases, method 400 further comprises receiving a user provided a function and/or generating a series of waypoints. In some cases, method 400 further comprises receiving an indication from a user of an individual or set of waypoints to move and/or changing the waveform in response. In some cases, the electron dose waveform is aperiodic.

In some cases, method 400 further comprises generating a waveform. For example, generating a waveform may comprise adjusting a waveform in response to various parameters, for example, the one or more parameters described herein with respect to FIG. 3. In some cases, method 400 further comprises implementing a sequence generation algorithm 140. The implementing may further comprise implementing one or more of components: 304, 306, 308, 310, 312, 314, 316, and 318 as described with respect to FIG. 3.

In some cases, method 400 further comprises one or more of the following: receiving an indication of an electron dose waveform at a waveform generator 304; generating an initial or preliminary waveform 306; adjusting the preliminary waveform 304 according to one or more constraints 308; iteratively updating an indication of a waveform to conform or substantially conform to the constraints 310; creating an updated waveform 312; adjusting the waveform according to one or more parameters in response to real-time sensor information 314; iteratively updating an indication of a waveform to conform or substantially conform to the real time sensor information 316; and outputting the corrected waveform to the deflector.

At an operation 420, the method 400 may comprise outputting an electron signal or an electron-induced signal relating to at least a portion of the modulated intensity. In some cases, the electron signal comprises signal which has propagated through the sample area. The electron signal may be collected from detector 104 of FIG. 1. The electron signal may comprise all or a portion of an image and/or associated image data for any of the electron microscope images as disclosed herein.

Processors and computers: In some instances, the disclosed systems may comprise one or more processors, computers, or computer systems configured for modulating an electron dose, including, for example, control, configuration, and synchronization of the electron dose modulation, as well as the storage, processing, analysis, and display of the acquired sensor data or applied modulation pattern. In some instances, the one or more processors, computers, and computer systems may be configured for control of other system functions and/or other data acquisition, storage, processing, analysis, or display functions as well.

Disclosed herein are computer implemented methods for modulating an electron dose on an electron microscope, e.g., a transmission electron microscope or any other electron microscope disclosed herein. The methods may comprise receiving at a processor an indication of an electron dose waveform comprising a representation of a temporal profile of an intensity of an electron dose directed to a sample area within the electron microscope. The methods may comprise transmitting the indication to the electron microscope. For example, an electrical signal representative of the indication may drive a deflector within the electron microscope to modulating the temporal profile of the electron dose. The methods may comprise receiving one or more tunable parameters, such as disclosed herein with respect to FIG. 3. For example, the one or more tunable parameters may comprise information about one or more of: a property of an image, a property of the deflector, a property of a driver electronics within the microscope, a property of a detector within the microscope, and the indication of the electron dose waveform. The methods may comprise updating the indication of the electron dose waveform based on the one or more parameters.

In some cases, methods comprise continuously updating the indication of the electron dose waveform. The methods may comprise use of a processor to perform one or more operations of the methods described herein. For example, a processor may receive an indication of an electron dose waveform, e.g., dose waveform 302. A processor may deliver the indication to the pattern generator within the beam deflection system 320a, 320b. The processor may also comprise instructions including the steps of a method to generate a waveform. The processor may also comprise instructions including the steps of a method to adjust a waveform in response to various parameters. Sequence generation algorithm 140 may comprise one or more of components: 304, 306, 308, 310, 312, 314, 316, and 318.

Figure 7:
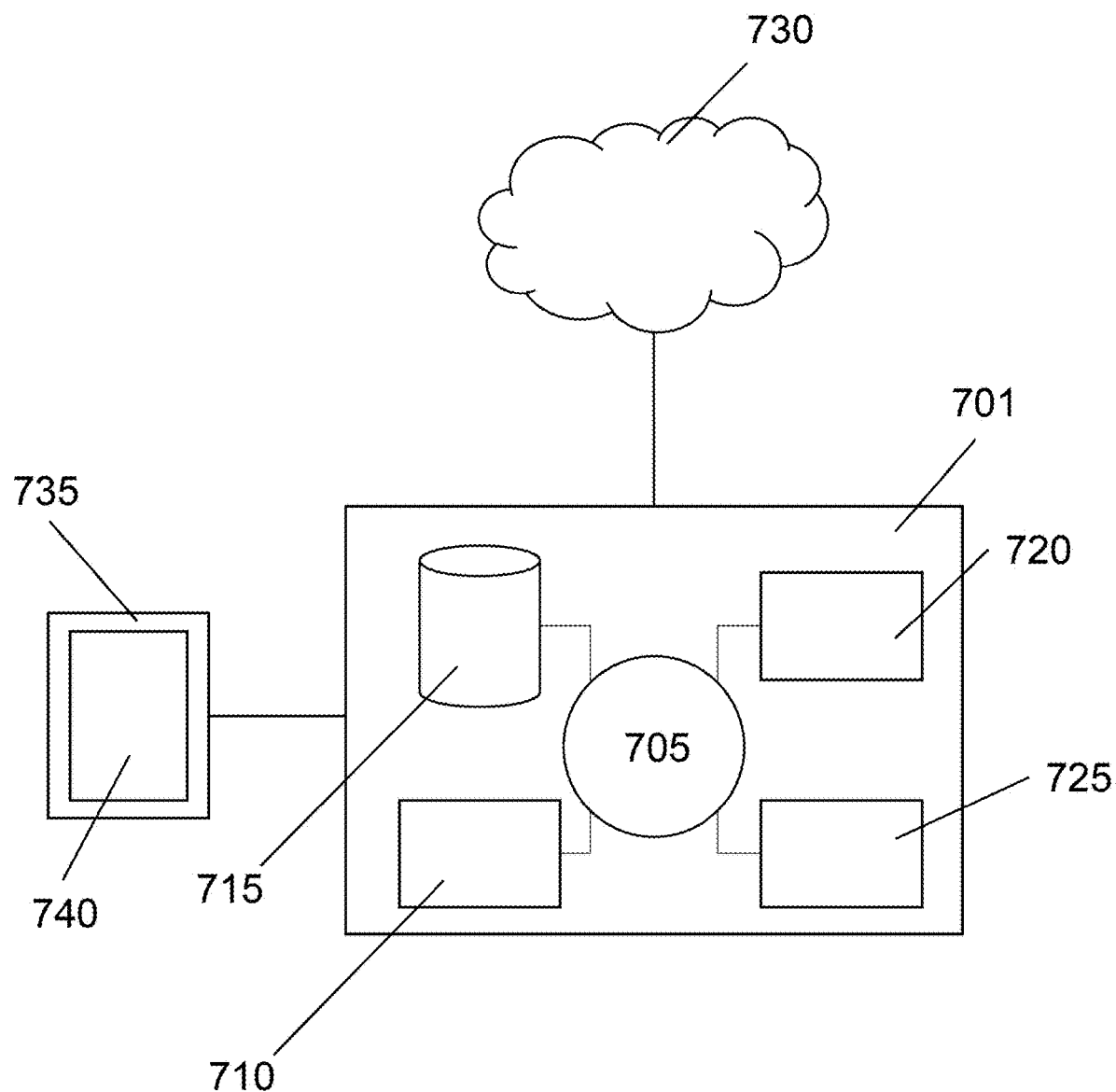
FIG. 7 illustrates one example of a computer system that may be used for implementing the electron dose modulation methods of the present disclosure.

FIG. 7 provides a schematic illustration of a computer system 701 that is programmed or otherwise configured to implement the methods described elsewhere herein (e.g., methods an electron dose waveform, the methods described herein, etc.). The computer system 701 can regulate various aspects of the disclosed methods and systems, such as, for example, the acquisition and processing of diffraction pattern data, image data, STEM data, spectroscopic data, or any combination thereof. The computer system 701 may comprise a local computer system, an electronic device (e.g., a smartphone, laptop, or desktop computer) of a user, or an electronic device of a user that is in communication with a computer system that is remotely located with respect to the electronic device. The computer system 701 may be a post-classical computer system (e.g., a quantum computing system).

The computer system 701 includes a central processing unit (CPU, also referred to as a "processor" or "computer processor" herein) 705, which can be a single core or multi core processor, or a plurality of processors for parallel processing. The computer system 701 also includes memory or a memory location 710 (e.g., random-access memory, read-only memory, flash memory), electronic storage unit 715 (e.g., a hard disk), a communication interface 720 (e.g., a network adapter) for communicating with one or more other systems, and peripheral devices 725, such as cache, other memory, data storage and/or electronic display adapters. The memory 710, storage unit 715, interface 720 and peripheral devices 725 are in communication with the CPU 705 through a communication bus (solid lines), such as a motherboard. The storage unit 715 can be a data storage unit (or data repository) for storing data. The computer system 701 can be operatively coupled to a computer network ("network") 730 with the aid of the communication interface 720. The network 730 may be the Internet, an internet and/or extranet, or an intranet and/or extranet that is in communication with the Internet. The network 730 in some cases is a telecommunication and/or data network. The network 730 can include one or more computer servers, which can enable distributed computing, such as cloud computing. The network 730, in some cases with the aid of the computer system 701, can implement a peer-to-peer network, which may enable devices coupled to the computer system 701 to behave as a client or a server.

The CPU 705 is configured to execute a sequence of machine-readable instructions, which can be embodied in a program or software. The instructions may be stored in a memory location, such as the memory 710. The instructions can be directed to the CPU 705, which can subsequently program or otherwise configure the CPU 705 to implement methods of the present disclosure. Examples of operations performed by the CPU 705 can include fetch, decode, execute, and writeback.

The CPU 705 may be part of a circuit, such as an integrated circuit. One or more other components of the system 701 may be included in the circuit. In some cases, the circuit is an application specific integrated circuit (ASIC).

The storage unit 715 is configured to store files, such as drivers, libraries and saved programs. The storage unit 715 may store user data, e.g., user preferences and user programs. The computer system 701 in some cases can include one or more additional data storage units that are external to the computer system 701, such as data storage units located on a remote server that is in communication with the computer system 701 through an intranet or the Internet.

The computer system 701 may communicate with one or more remote computer systems through the network 730. For instance, the computer system 701 may communicate with a remote computer system of a user (e.g., a cloud server). Examples of remote computer systems include personal computers (e.g., a desktop PC), portable personal computers (e.g., a laptop or tablet PC), smart phones (e.g., Apple® iPhone, Android-enabled devices, etc.), or personal digital assistants. The user may access the computer system 701 via the network 730.

Software & algorithms: As discussed above, in some instances, the disclosed systems may further comprise software for: (i) providing an electron source directed toward a sample area; (ii) receiving an electron dose waveform at a deflector disposed between the electron source and the sample area, wherein the electron dose waveform modulates an intensity of the electron source directed to the sample area according to the electron dose waveform; (iii) outputting an electron signal or an electron-induced signal relating to at least a portion of the modulated intensity. In some cases, the electron signal comprises a signal which has propagated through the sample area. In some instance, the processor may comprise software for performing one or more steps of sequence generation algorithm 140, such as, one or more of components: 304, 306, 308, 310, 312, 314, 316, and 318. In some instances, the processor may comprise software for control of other system functions and/or other data acquisition, storage, processing, analysis, or display functions as well.

In some instances, the methods described herein may be implemented by way of machine (e.g., computer processor) executable code stored on an electronic storage location of a computer system such as that illustrated in FIG. 7 (such as, for example, in memory 710 or electronic storage unit 715 of computer system 701). The machine executable or machine-readable code can be provided in the form of software. During use, the code can be executed by the processor 705. In some cases, the code can be retrieved from the storage unit 715 and stored on the memory 710 for ready access by the processor 705. In some situations, the electronic storage unit 715 can be precluded, and machine-executable instructions are stored on memory 710.

In some instances, the code can be pre-compiled and configured for use with a machine having a processor adapted to execute the code. In some instances, the code may be compiled during runtime. The code can be supplied in a programming language that can be selected to enable the code to execute in a pre-compiled or as-compiled fashion.

Aspects of the methods and systems provided herein, such as the computer system 701, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as in memory (e.g., read-only memory, random-access memory, flash memory) or on a hard disk. "Storage" type media can include any or all of the tangible memory of the computer system, computer processors, or the like, or associated modules thereof, such as various semiconductor memory devices, tape drives, disk drives, optical drives, and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer system or the like that may be used to implement databases. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 701 may include or be in communication with an electronic display 735 that comprises a user interface (UI) 740 for providing, for example, an interface for a user to input instructions, upload data to a computer database, download data from a computer database, etc. Examples of UI's include, without limitation, a graphical user interface (GUI) and web-based user interface.

In some instances, the methods and systems of the present disclosure may be implemented through the use of one or more algorithms, e.g., an algorithm comprising instructions for acquiring and/or processing diffraction pattern data, image data, and the like. An algorithm may comprise sequence generation algorithm 140, for example, an algorithm including one or more of components: 304, 306, 308, 310, 312, 314, 316, and 318. An algorithm can be implemented by way of software upon execution by the central processing unit 705.

EXAMPLES

The following examples are given for the purpose of illustrating various embodiments of the invention and are not meant to limit the present invention in any fashion. The present examples, along with the methods described herein are presently representative of preferred embodiments, are exemplary, and are not intended as limitations on the scope of the invention. Changes therein and other uses which are encompassed within the spirit of the invention as defined by the scope of the claims will occur to those skilled in the art.

Figure 5:
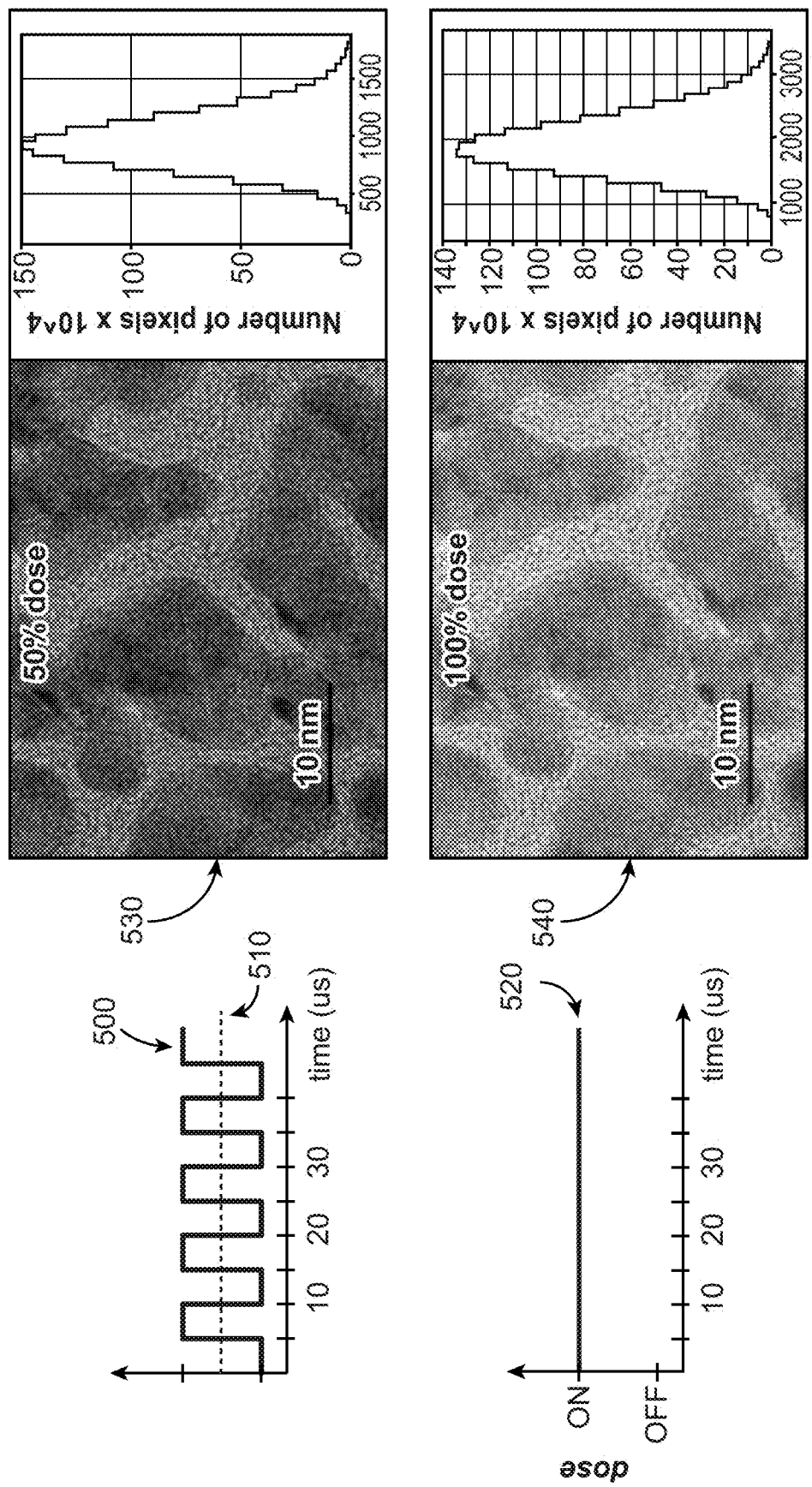
FIG. 5 shows examples of high resolution TEM images taken with dose attenuation using an electron dose waveform modulated by a deflector.

FIG. 5 shows examples of high resolution TEM images taken with various dose attenuations using an electron dose waveform modulated by a deflector. The first dose waveform (500) has pulse width 5 μs and period (defined as the time between the rising edges of adjacent pulses) 10 μs. The average illumination rate (510) is 50%. The second dose waveform (520) is constantly on and the average illumination rate is 100%. The TEM image taken at 50% dose rate (530) shows no noticeable distortions or blur compared to the image at 100% dose rate (540). However, the average number of electrons detected per pixel in image 530 is half as large as in image 520. The images were taken at 200 kV accelerating voltage using a sample of gold nanoparticles on a carbon grid. The dose attenuation, described elsewhere herein, comprises the value 100%–dose rate expressed as a percentage.

Figure 6:
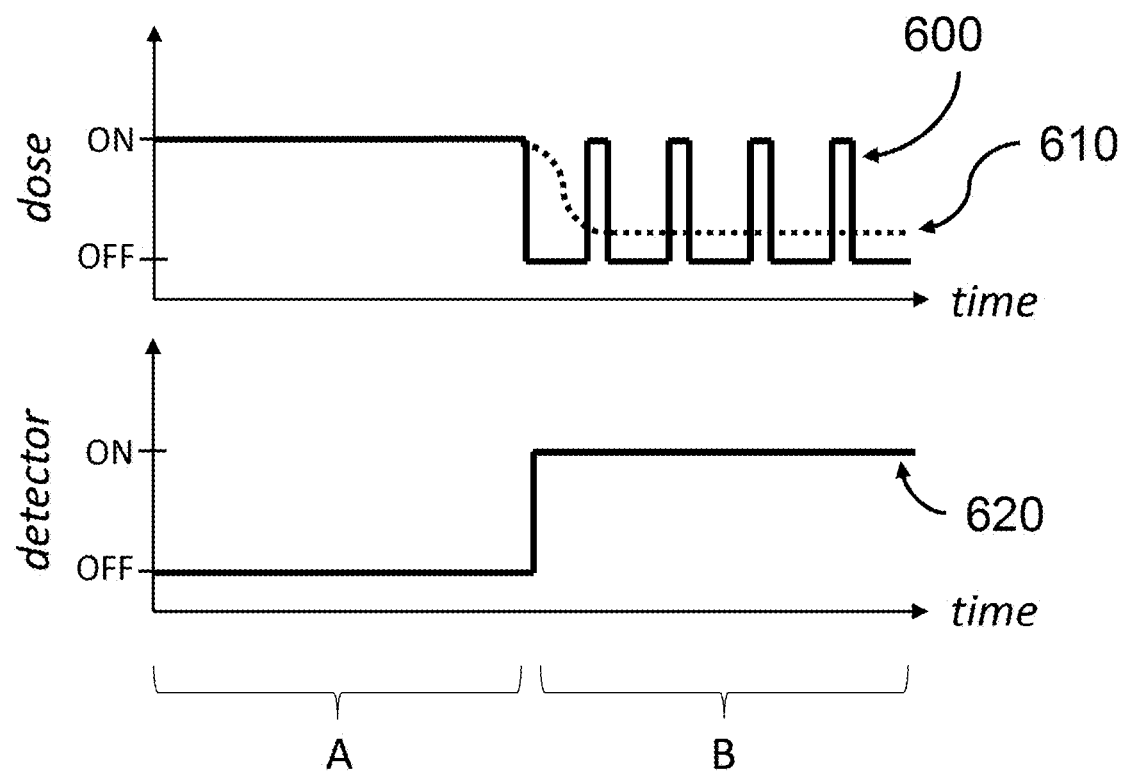
FIG. 6 shows a schematic of a high resolution electron microcopy experiment using an electron dose waveform modulated by a deflector.

FIG. 6 shows a schematic of an electron microscopy experiment using an electron dose waveform modulated by a deflector. The schematic shows pulsed illumination which varies over time as the experiment progresses, to accommodate a detector which can process a low electron dose rate. During stage A, the dose waveform (600) is at 100% illumination and the detector (620) is disabled. The high electron dose initiates a process of interest in the sample. During stage B, the dose waveform (600) transitions to a pulsed mode with 25% average illumination (610). The reduced illumination during stage B is consistent with the detector's optimal range of operation. The detector is enabled during stage B and the detector records the sample's response to the high electron dose that was applied during stage A. The dose attenuation may be continuously varied over time to allow continuously variable or intermittent pulse modulation.

Table 1 and Table 2 show example modes of use for a deflector configured to modulate an electron dose waveform as described herein. For example, a deflector may be used as a fast electron beam blanker for various image modalities. For example, a deflector may be used to attenuate the electron beam and/or to perform experiments which involve a degree of control over the shape of the electron beam. These potential applications should not be considered limiting. In some cases, various products may be shipped with capability for one or both example modes shown in Table 1 and Table 2.

Table 1 below shows example values of the maximum pulse duration, transition time, minimum pulse width, and number of blanking signal inputs at various acceleration voltages. One example implementation of the electron dose waveform modulation described herein is rapid beam blanking system to provide accurate electron microscopy images in, for example, transmission or reflection modalities.

TABLE 1

| Beam Blanking Mode | | | |
| --- | --- | --- | --- |
| Accelerating Voltage | 300 kV | 200 kV | 80 kV |
| Maximum pulse duration | 500 kHz | 750 kHz | 1 MHz |
| Transition time | | <50 ns | |
| Minimum pulse width | | 100 ns | |
| Blanking signal inputs | | 3 inputs | |

Table 2 below shows example pulse repetition frequency maxima, repetition frequency minima, and duration for various electron dose modulation types. One example implementation of the electron dose waveform modulation described herein is rapid attenuation and/or beam shaping application for electron microscopy images in, for example, transmission, or reflection modalities. The table also shows potential applications for each dose modulation type. For example, type A may be more useful for TEM imaging, and type B may be more useful for TEM and/or STEM and/or pump probe imaging. These potential applications should not be considered limiting. For example, type B may be useful for TEM imaging, and type A may be useful for TEM and/or STEM and/or pump probe imaging. In some cases, various products may be shipped with capability for one or both of type A and type B.

TABLE 2

Dose Attenuation/Beam Shaping Mode

| Configuration | Electron Dose Modulation A | Electron Dose Modulation B |
|---|---|---|
| Application | TEM imaging | TEM and/or STEM and/or Pump Probe |
| Pulse repetition frequency maximum | 62.5 kHz | 500 kHz @ 300 keV, 1 MHz @ 200 keV |
| Pulse repetition frequency minimum | 16 µs | 2 µs |
| Pulse duration, fastest | 125 ns | 100 ns |

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in any combination in practicing the invention. It is intended that the following claims define the scope of the invention and that methods and structures within the scope of these claims and their equivalents be covered thereby.

What is claimed is:

1. A method for modulating a dose in a transmission electron microscope image, comprising:
   (a) providing an electron source directed toward a sample area;
   (b) receiving an electron dose waveform at a deflector disposed between the electron source and the sample area, wherein the electron dose waveform is configured to modulate an intensity of the electron source directed toward the sample area according to the electron dose waveform, and wherein the electron dose waveform comprises an arbitrarily defined temporal profile; and
   (c) outputting an electron signal or an electron-induced signal relating to at least a portion of the intensity modulated according to the electron dose waveform.

2. The method of claim 1, wherein the electron dose waveform comprises a continuously variable temporal profile.

3. The method of claim 1, wherein the electron dose waveform comprises a series of waypoints.

4. The method of claim 3, wherein the series of waypoints are individually or collectively selectable to construct the arbitrarily defined temporal profile.

5. The method of claim 3, wherein the series of waypoints comprises greater than 1000 waypoints.

6. The method of claim 1, wherein the arbitrarily defined temporal profile comprises a temporal resolution of less than 10 nanoseconds (ns).

7. The method of claim 1, further comprising receiving an indication of the arbitrarily defined temporal profile from a user.

8. The method of claim 1, further comprising providing a device comprising: the electron source directed toward the sample area; a detector for receiving the electron signal or the electron-induced signal; and the deflector, wherein the deflector is positioned between the electron source and the sample area, and wherein the deflector modulates the intensity of the electron source directed toward the sample area.

9. The method of claim 1, further comprising:
   (i) measuring damage to a sample comprising the sample area; and
   (ii) varying the electron dose waveform in response to the measured damage to the sample.

10. The method of claim 9, wherein (ii) further comprises controlling a rate or an intensity of the electron dose waveform.

11. The method of claim 10, wherein the rate is varied according to a bandwidth of a detector for receiving the electron signal or the electron-induced signal.

12. The method of claim 1, further comprising varying the electron dose waveform to control effects of an electron dose on a sample comprising the sample area.

13. The method of claim 1, further comprising:
   (i) inducing damage to a sample comprising the sample area by a burst of intensity from the electron source; and
   (ii) measuring the sample after the burst at an intensity lower than the burst.

14. The method of claim 1, further comprising: spatially varying an intensity of the electron dose waveform.

15. The method of claim 1, wherein the electron dose waveform modulates the intensity of the electron source substantially without change to other image conditions.

16. The method of claim 1, further comprising:
   (i) providing a pump pulse of the electron dose waveform at a first time; and
   (ii) providing a probe pulse of the electron dose waveform at a second time, wherein the probe pulse is configured to probe time-dependent processes in a sample comprising the sample area in response to the pump pulse.

17. A computer-implemented method for modulating an electron dose on a transmission electron microscope (TEM), comprising:
   (a) receiving at a processor an indication of an electron dose waveform comprising a representation of a temporal profile of an intensity of an electron dose directed to a sample area within the TEM;
   (b) transmitting the indication to the TEM, wherein an electrical signal representative of the indication drives a deflector within the TEM, thereby modulating the temporal profile of the intensity of the electron dose;
   (c) receiving one or more tunable parameters; and
   (d) updating the indication of the electron dose waveform based on the one or more tunable parameters.

18. The computer-implemented method of claim 17, further comprising continuously updating the indication of the electron dose waveform.

19. The computer-implemented method of claim 17, further comprising providing a device comprising: an electron source directed toward the sample area; a detector for receiving an electron signal or an electron-induced signal; and the deflector, wherein the deflector is positioned between the electron source and the sample area, and wherein the deflector modulates an intensity of the electron source directed toward the sample area.

20. The computer-implemented method of claim 17, wherein the one or more tunable parameters comprise information about one or more of: a property of a TEM image, a property of the deflector, a property of a driver electronics within the TEM, a property of a detector within the TEM, a property of a sample, and the indication of the electron dose waveform.

21. The computer-implemented method of claim 20, wherein the one or more tunable parameters comprise information about the property of the sample.

22. The computer-implemented method of claim 21, wherein the one or more tunable parameters comprise information about a damage to the sample.

23. The computer-implemented method of claim 17, wherein the electron dose waveform comprises a continuously variable temporal profile.

24. The computer-implemented method of claim 17, wherein the electron dose waveform comprises an arbitrarily defined temporal profile.

* * * * *